United States Patent
Ma et al.

(10) Patent No.: US 6,283,355 B1
(45) Date of Patent: Sep. 4, 2001

(54) END EFFECTOR FOR SUBSTRATE HANDLING

(75) Inventors: Edmund L. Ma, Alameda; Christopher O. Lada; Donald H. Langhans, both of Palo Alto, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/503,748

(22) Filed: Feb. 14, 2000

Related U.S. Application Data

(62) Division of application No. 09/107,917, filed on Jun. 30, 1998, now Pat. No. 6,073,828.

(51) Int. Cl.$^7$ ..................................... B23K 37/04
(52) U.S. Cl. .................... 228/44.3; 228/44.7; 228/49.1; 228/49.5
(58) Field of Search ................... 228/44.3, 44.7, 228/49.1, 49.5; 269/902, 903; 414/935, 936, 937, 938, 939, 940, 941

(56) References Cited

U.S. PATENT DOCUMENTS

| | | | |
|---|---|---|---|
| 4,002,254 | * | 1/1977 | Olofsen . |
| 4,023,691 | * | 5/1977 | Perel . |
| 4,153,164 | * | 5/1979 | Hofmeister et al. . |
| 4,490,087 | * | 12/1984 | Ryan et al. . |
| 4,727,993 | * | 3/1988 | Mirkovich et al. . |
| 4,743,156 | * | 5/1988 | Raffay et al. . |
| 4,801,168 | * | 1/1989 | Sato . |
| 5,429,251 | * | 7/1995 | Matthews . |
| 5,697,748 | * | 12/1997 | Somekh et al. . |
| 5,858,103 | * | 1/1999 | Nakajima et al. . |
| 5,915,957 | * | 6/1999 | Tanigawa . |
| 5,960,960 | * | 10/1999 | Yamamoto . |
| 6,010,009 | * | 1/2000 | Peterson et al. . |
| 6,048,162 | * | 4/2000 | Moslehi . |
| 6,092,981 | * | 7/2000 | Pfeiffer et al. . |
| 6,093,644 | * | 7/2000 | Inaba et al. . |
| 6,164,894 | * | 12/2000 | Cheng . |
| 6,171,400 | * | 1/2001 | Wingo . |

FOREIGN PATENT DOCUMENTS

405152228A * 6/1993 (JP) .

* cited by examiner

*Primary Examiner*—Tom Dunn
*Assistant Examiner*—Kiley Stoner
(74) *Attorney, Agent, or Firm*—Martine & Penilla, LLP

(57) ABSTRACT

An end effector has a tower with non-stacked spatulas. Tolerance stacking is avoided by making grooves in the tower relative to a common reference surface, and mounting the spatulas in such grooves. The grooves are provided in separate planar walls of the tower. The walls intersect to enhance the structural properties of the tower. The tower has a dual-purpose clamp formed integrally with one wall for use in assembling the tower and the spatulas, and for mounting the completed end effector in a load lock. The spatula may carry a wafer during various operations, e.g., semiconductor processing, material deposition and etching systems, or in flat panel display processing systems. The carrying of the wafers is notwithstanding vibration of equipment for performing the manufacturing operations, which vibration is primarily in a range of frequencies. Each spatula is formed with a planar platform having an aperture formed therein such that the platform carrying the wafer has a resonant frequency dimensioned so that the resonant frequency while carrying the wafer is outside of the range of frequencies of the equipment vibration. Holes are provided around the aperture, and the spatula is provided with a pad for assembly with each of the holes. Each of the pads has a wafer support surface and a plurality of legs depending from the support surface. The legs are flexed to permit reception of the pad in one of the holes. Methods are disclosed for making the tower, the spatulas, and the end effector with these features.

10 Claims, 21 Drawing Sheets

END EFFECTOR FOR SUBSTRATE HANDLING

This application is a divisional of Ser. No. 09/107,917 filed Jun. 30, 1998 U.S. Pat. No. 6,073,828.

BACKGROUND OF THE INVENTION

1. Field of the Invention

The present invention relates generally to substrate handling, and more particularly, to towers for positioning substrates and to methods of efficiently manufacturing the towers, components of such towers, and end effectors using such towers and components.

2. Description of the Related Art

Transport chambers are generally used in conjunction with a variety of substrate processing chambers, which may include semiconductor processing systems, material deposition systems, and flat panel display processing systems. Growing demands for cleanliness and high processing precision increase the need for reduced amounts of human interaction between the processing steps. This need has been partially met by transport chambers, which operate as intermediate handling apparatus between such processing steps.

In the use of transport chambers, when a substrate is required for processing, a robot arm within the transport chamber may be used to retrieve a selected substrate from storage and place it into one of the multiple processing chambers. Transport of substrates among multiple storage facilities and processing chambers is typically referred to as cluster tool architecture.

FIGS. 1A and 1B schematically illustrate a typical cluster tool architecture. substrates 101 may be stored in a clean room 102. The substrates 101 may be the base on which layers are deposited in semiconductor processing, or by the material deposition systems, or may be a support used in the flat panel display processing systems, for example. Such substrates are very fragile, giving rise to a need to carefully handle the substrates. The substrates 101 are commonly referred to as wafers.

A load lock 104 is generally coupled to the clean room 102. In addition to being a retrieving and serving mechanism, the load lock 104 also serves as a pressure varying interface between the clean room 102 and a transport chamber 106 that interfaces with various processing chambers 108a–108c. FIG. 1B shows in more detail a cassette 110 in the clean room 102 for storing the substrates 101. The load lock 104 has a prior art end effector 112 within it. A drive assembly 114 serves to move an arm assembly 116 connected to the end effector 112. As described below, the prior art end effector 112 is made by alternately stacking prior art spatulas 118 and spacers 120. The load lock 104 also interfaces with the various processing chambers 108a–108c by way of a main robot arm 122 of the transport chamber 106.

In use, the end effector 112 of the load lock 104 is moved through a port 124 of the clean room 102 and receives a supply of the wafers 101. In detail, each spatula 118 receives one of the wafers 101 from the cassette 110 and supports the wafer 101 for transport. The end effector 112 is then moved out of the clean room 102 and back into the load lock 104, where the wafers 101 are stored prior to being used for processing. Such processing is initiated by the main robot arm 122. reaching into the load lock 104 and removing one of the wafers 101 from the supported position on the spatula 118.

It may be appreciated that two wafer transfer operations are required to move the wafers 101 from the clean room 102 into a processing chamber 108, and that each such transfer operation is to be accomplished without human intervention. For the first transfer, the spatulas 118 of the end effector 112 must be aligned with the wafers 101 contained in the cassette 110. If not aligned, horizontal movement of the end effector 112 toward the cassette 110 may cause one or more of the spatulas 118 to move horizontally and hit one or more of the wafers 101. Such hitting may break the wafers 101, or otherwise damage the wafers 101, as by scratching an upper device surface 126, of the wafers 101. While this type of damage to a wafer 101 is a significant cost factor in such processing, a greater cost factor results when the end effector 112 is not aligned with the main robot arm 122 in a second wafer transfer operation. For example, when the processing of the wafer 101 is substantially complete, the value of the wafer 101 includes the increased cost of the processing that has taken place since the wafer 101 left the clean room 102. However, the first wafer transfer operation has a greater potential of damaging multiple wafers, resulting in a higher cost of production.

Attempts have been made to provide end effectors 112 with spatulas 118 accurately aligned with both the cassette 110 (and the wafers 101 therein) and the main robot arm 122. One such attempt is to make a stack of alternating spatulas 118 and spacers 120 as shown in FIG. 1C. There, bolts 132 are illustrated for squeezing the spatulas 118 and the spacers 120 together to form the end effector 112. Referring to FIG. 1C, a desired relative positioning of the spatulas 118 is depicted by reference lines 128. This desired relative positioning will properly align each spatula 118 with the wafers 101 that are in the cassette and with the robot arm 122 for transfer among the cassette 110, the load lock 104, and the transport chamber 106. To achieve the desired relative spacing of the spatulas 118 of the end effector 112, attempts are made to hold the thickness T of every one of the spacers 120 and every one of the spatulas 118 within a very close tolerance. For example, the same desired relative positioning is indicated in FIG. 1D by the reference lines 128. However, the actual relative positioning (shown by reference lines 130 and 130U) differs significantly from the desired relative positioning even though the spatulas 118 and the spacers 120 are within the desired tolerance (are in-tolerance). In this example, the significant difference is due to the thickness TT of spacers 120TT being at the thick end of the tolerance. Such thicknesses TT are shown in FIG. 1D accumulating, and resulting in and in-tolerance spacer 120 and the in-tolerance upper spatulas 118U being positioned above the reference lines 128 and 128U, indicating misalignment of the spatulas 118U. Such misalignment of the spatulas 118U with the reference lines 128 and 128U resulting from the accumulation of tolerances is referred to as tolerance stacking. Although not shown in FIG. 1D, such misalignment of the spatulas 118U with the reference lines 128 may also result from the accumulation of tolerances that are at the thin end of the desired tolerance. Tolerance stacking is a significant cause of the wafer damage problem described above.

These misalignment problems not only cause the noted wafer damage problems, but may also result in damage to the prior art end effectors 118. Such end effector damage may require retooling of the prior art end effector 118, such as by shutting down the operation of the load lock 104, removing the prior art end effector 112 and replacing any broken spatulas 118, for example.

It may be appreciated that the use of the stacked spatulas 118 and the spacers 120 for the prior art end effectors 112 is dependent on the success of expensive efforts to make each of the spatulas 118 and each of the spacers 120 within very tight tolerances, e.g. plus or minus 0.0005 inches. Also, selection of spatulas 118 and spacers 120 for use in a particular end effector 112, and other costly steps necessary to attempt to reduce tolerance stacking in stacked arrangements of spatulas 118 and spacers 120, give rise to an unfilled need to avoid using the stacked arrangements. Further, when these expensive manufacturing efforts fail, the noted significant cost factors (e.g., damage to an unprocessed wafer 101, or misalignment of the end effector 112, causing damage to a wafer 101 that has been substantially completely manufactured), are but a part of the resulting costs because process shut-down and reworking of the end effectors 112 may also be required to correct the end effector misalignment. Of course, any shut down situation tends to reduce the yield or productivity of the processing and should be avoided.

In addition to these direct costs resulting from such misalignment problems, the risk of contamination is a factor in the prior art end effectors 112 due to the multiple separate parts that are used to make such end effectors 112.

SUMMARY OF THE INVENTION

The present invention fills the need that is unfilled by the prior art end effectors by disclosing an end effector having a tower with non-stacked spatulas, and a method of making the tower, the spatulas and the end effector. In the described embodiments, the problem of tolerance stacking is avoided by making grooves in the tower relative to a common reference surface, and mounting the spatulas in such grooves. Also, the grooves are provided in separate walls of the tower. The walls are planar and intersect to enhance the structural properties of the tower. The tower also has a dual-purpose clamp formed integrally with one wall for use in assembling the tower and the spatulas, and for mounting the completed end effector in the load lock.

Advantageously, one embodiment of the present invention contemplates using the spatula for carrying a wafer during operations in semiconductor processing, or of material deposition systems, or in flat panel display processing systems. The ability to carry the wafers is notwithstanding vibration of equipment for performing the manufacturing operations. The vibration of the equipment used in such processing or systems is primarily in a range of frequencies. Each spatula is formed with a planar platform having a mounting section and a wafer carrying section. The wafer-carrying section has an aperture formed therein such that the platform carrying the wafer has a resonant frequency. In this embodiment, the aperture is dimensioned so that the resonant frequency of each unit (a spatula while carrying the wafer) is outside of the range of frequencies of the vibration of the equipment.

In another embodiment of the present invention, the wafer-carrying section is provided with a plurality of holes around the aperture. In conjunction with the holes, the spatula is provided with a pad for assembly with each of the holes. Each of the pads has a wafer support surface and a plurality of legs depending from the support surface. Each of the legs has a distal end provided with a retainer edge and is flexible. The legs are flexed to permit the distal ends to be received in one of the holes. Upon receipt of the distal ends in the hole the retainer edges of the distal ends retain the pad in the hole with the support surface positioned to carry the wafer. The unit defined by the platform with the pad carrying the wafer is provided with the resonant frequency.

In a further embodiment of the present invention, there is provided a method of making a tower for holding end effector components, such as the spatulas. The components are to be accurately held relative to each other, and the tower is provided with a column having a reference ledge that defines a common reference surface. The method includes an operation of forming a reference groove in the column, the reference groove being dimensioned to receive one of the components and defining the reference ledge at an accurate location above a base of the column. First and second additional grooves are formed in the column. The first and second additional grooves are each dimensioned to receive another one of the components, and each defines a respective first and second additional ledge. In this embodiment, the operations of forming the first and second additional ledges are performed to provide the first additional ledge spaced by a selected distance from the common reference surface defined by the reference ledge, and to provide the second additional ledge spaced from the common reference surface by a multiple of the selected distance. In this manner, the first and second additional ledges are evenly and accurately spaced from the common reference surface and from each other, which is the desired relative spacing. These forming operations avoid the tolerance stacking problems of the prior art end effectors since once the reference groove is made to establish the reference ledge with the common reference surface, each of the successive additional ledges is made with reference to the common reference surface rather than with reference to the first additional or second additional or any successive previously made additional ledge.

Another aspect of the present invention is providing such method by forming a plurality of the first additional. grooves in the column according to the performing operation, wherein the multiple of the selected distance is increased by one for each of the plurality of the first additional grooves.

Still another aspect of such method contemplates having each of the grooves further define a staking section opposite to a respective one of the first and second ledges. Each groove has a given height to receive one of the components. The method further includes the operation of fabricating the column from material that is deformable by staking to reduce the given height of the grooves.

Yet another aspect of the present invention is a method of making an end effector for holding piece parts, such as wafers, wherein the wafers are to be accurately held relative to each other. The end effector includes a tower and a spatula, the spatula having a first edge. The method is performed by providing the tower with a plurality of grooves, each of the grooves defining a ledge and a staking portion opposite to the ledge. After making a reference groove, respective ones of the next ledges are spaced from a common reference surface by a selected distance and a different multiple of the selected distance to provide the next grooves and the next ledges without tolerance stacking. Also, the method includes inserting the first edge of the spatula into one of the grooves with the spatula on the ledge of the one groove. Staking the staking portion of the one groove is performed to hold the inserted first edge of the spatula against the ledge of the one groove.

A further aspect of the present invention contemplates a method of making an end effector for positioning wafers for processing, wherein the wafers are to be accurately positioned relative to each other. The end effector includes a tower and a plurality of spatulas. The method contemplates operations including making a reference groove to provide a reference ledge that defines a common reference surface, and providing a plurality of the spatulas. The tower is provided with a plurality of additional grooves, each of the additional grooves defining an additional ledge and a staking portion opposite to the additional ledge. Respective ones of the additional ledges are spaced from the common reference surface by a selected distance and by different multiples of the selected distance to accurately and uniformly space the respective additional grooves and ledges from the reference ledge without tolerance stacking.

Each of the grooves has a width dimensioned to loosely receive one of the spatulas. One of the spatulas is inserted into one of the grooves with the one spatula on the ledge of the one groove. By staking the staking portion of the groove to decrease the width of the one groove, the inserted spatula is held against the respective ledge. Then, the inserting and staking operations are repeated until all of the plurality of spatulas have been held in successive ones of the grooves by the respective staked staking portions. The staking operation is performed at each of a plurality of spaced locations along the staking portion.

In another aspect of the present invention, the inserting and staking operations define a space between each of the respective spatulas and the staking portion of a respective groove. The method further forces brazing filler into each of the spaces between each of the spatulas and the staking portions of the respective grooves. Another operation provides each of the spatulas with a free edge opposite to a respective groove. A plurality of brazing fixtures are provided with a plurality of slots, each of the slots defining an edge support. Respective ones of the edge supports are spaced from the common reference surface by the selected distance and by a different multiple of the selected distance to provide the slots and the edge supports without tolerance stacking. Upon completing all of the operations to insert the spatulas into the grooves, each respective free edge of the spatulas is inserted into a respective slot, and a spring clip is inserted into the respective slot to urge the spatula against the respective edge support. A fixtured end effector results from this method.

To complete the end effector, the present invention contemplates gradually preheating the fixtured end effector and dip brazing the heated fixtured end effector to secure the spatulas to the tower without tolerance stacking.

These and other advantages of the present invention will become apparent upon reading the following detailed descriptions and studying the various figures of the drawings.

BRIEF DESCRIPTION OF THE DRAWINGS

The invention, together with further advantages thereof, may best be understood by reference to the following description taken in conjunction with the accompanying drawings.

DETAILED DESCRIPTION OF THE PREFERRED EMBODIMENTS

Figure 1A:
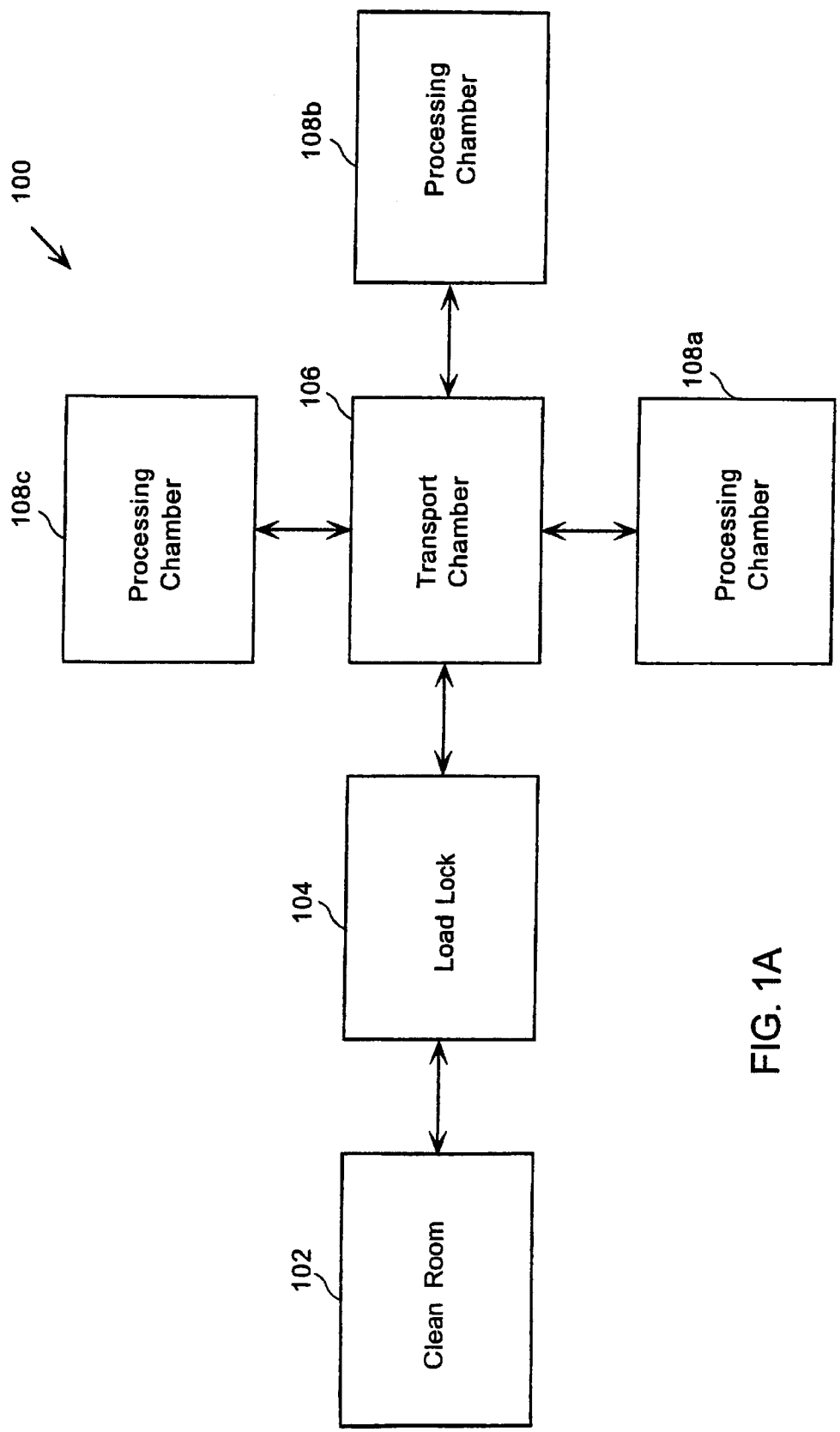
FIG. 1A is a diagrammatic illustration of a typical prior art cluster tool architecture which illustrates how various processing chambers may be coupled to a transport chamber which operates with a load lock which receives wafers from a clean room.
Figure 1B:
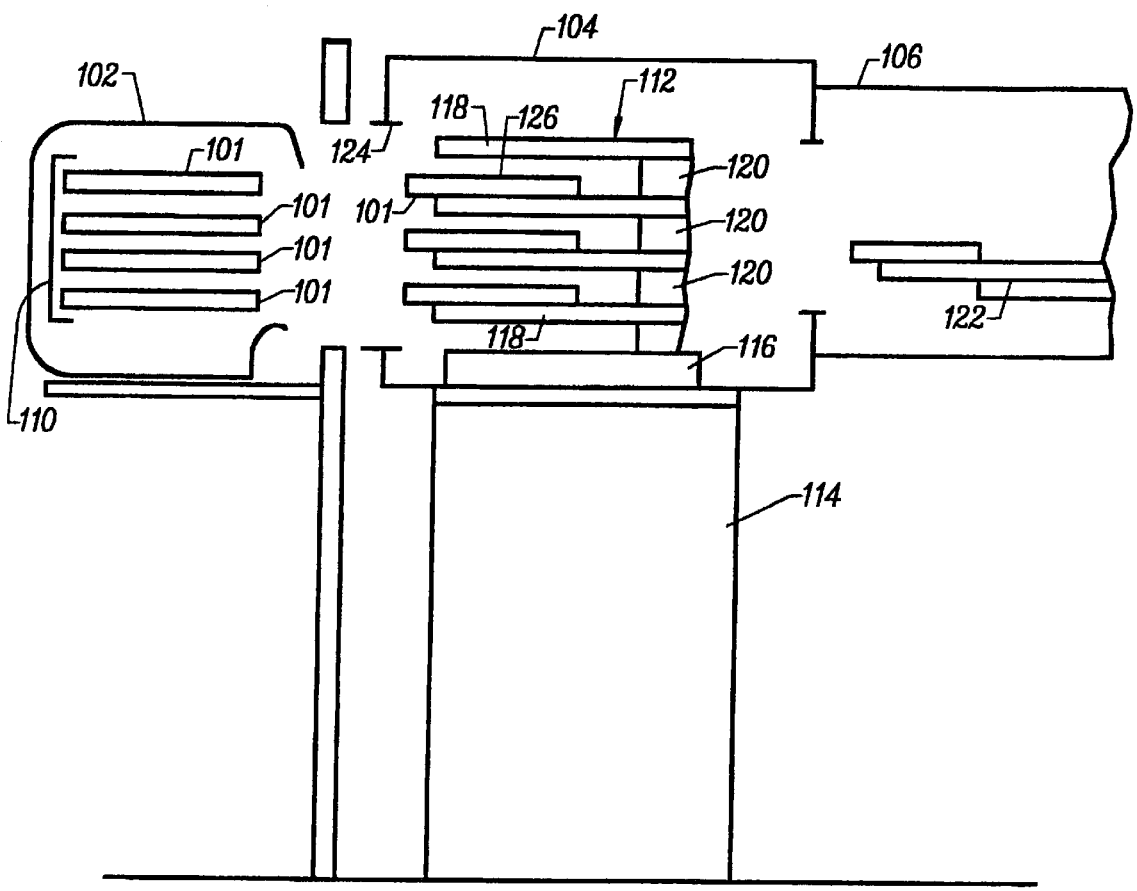
FIG. 1B is an elevational view of a portion of the cluster tool architecture illustrating the load lock transporting a supply of wafers received from a cassette in the clean room for delivery to the transport chamber.
Figure 1C:
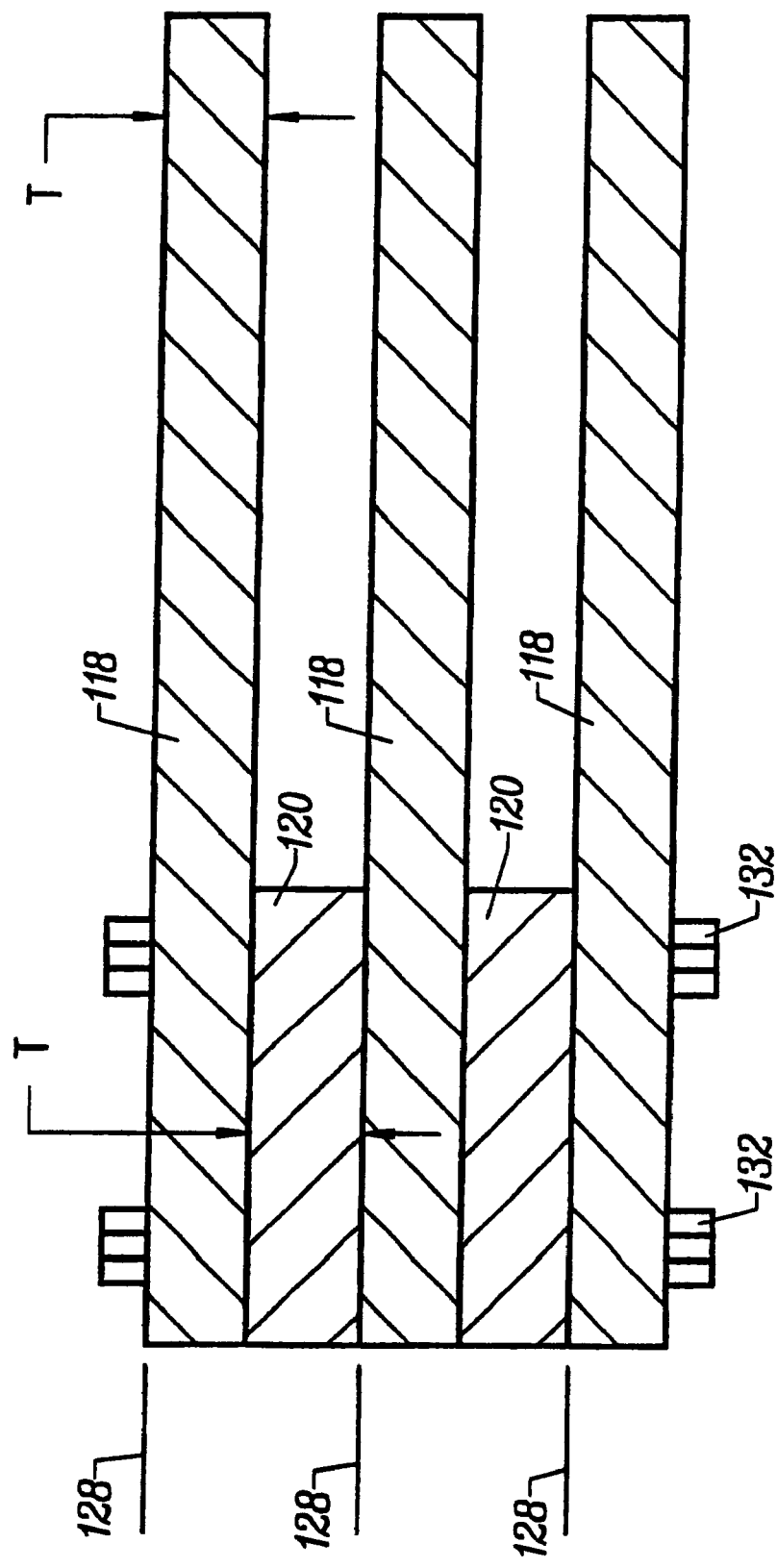
FIG. 1C is an enlarged elevational view of a prior art end effector illustrating a stack of spacers and spatulas held assembled by bolts.
Figure 1D:
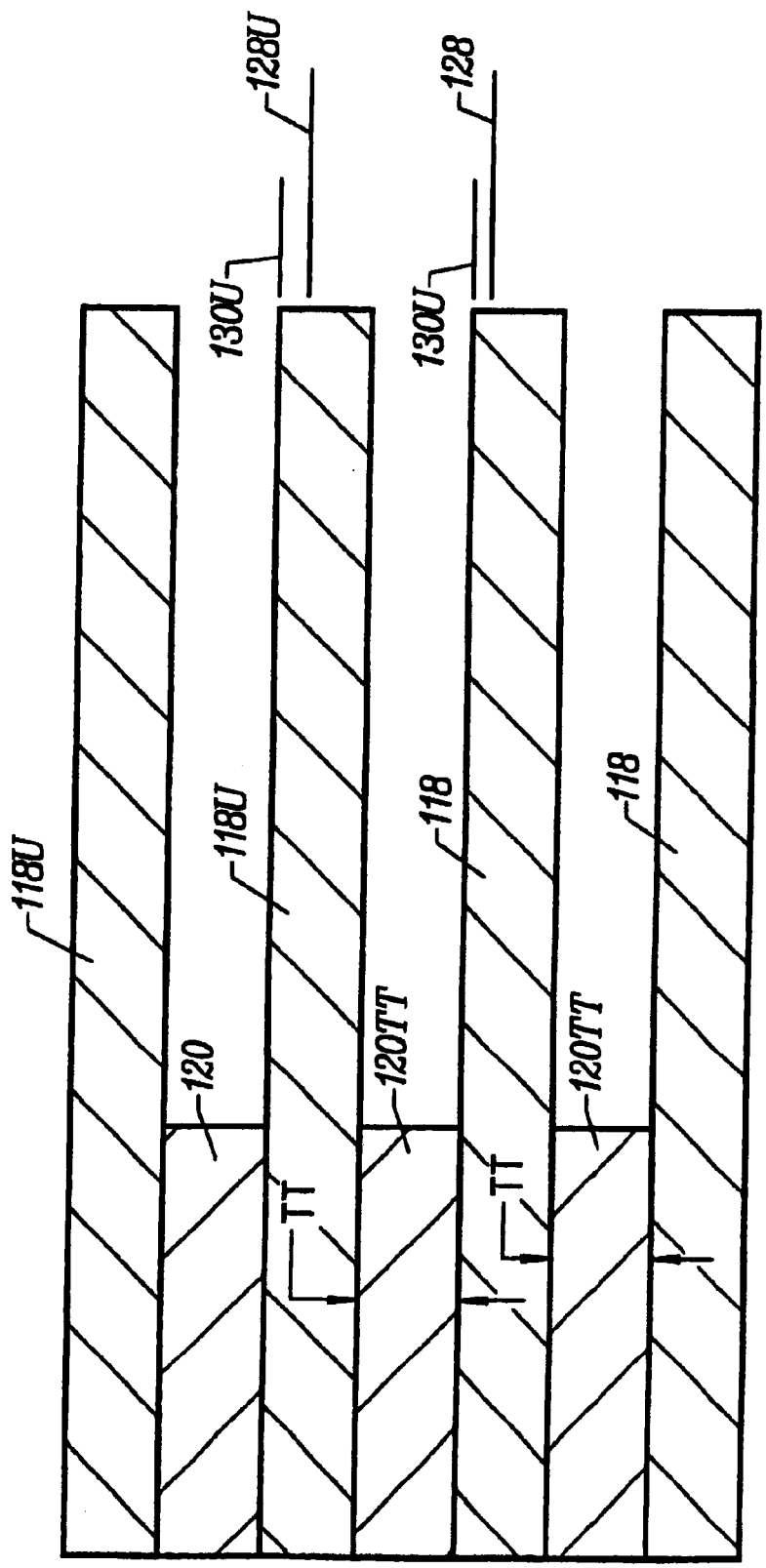
FIG. 1D is an enlarged elevational view of the prior art end effector shown in FIG. 1C illustrating the stack of spacers and spatulas in an undesirable tolerance stacking situation.

As described above, FIGS. 1C and 1D illustrate the problem of tolerance stacking, in which there are significant differences between the desired relative positioning of exemplary prior art spatulas 118 (indicated by reference lines 128 and 128U), and actual relative positioning of the exemplary prior art spacers 120TT (indicated by reference lines 130 in FIG. 1D). In the example, the significant differences are due to the thicknesses TT of spacers 120TT being at the thick end of the desired tolerance. Such thicknesses TT are shown in FIG. 1D as accumulating, and resulting in the actual positioning (indicated by reference lines 130 and 130U) of upper spatulas 118U above the reference lines 128 and 128U. The actual positioning indicates misalignment of the spatulas 118U, as described above. It was noted that such misalignment of the spatulas 118U with the reference lines 128 may also result from the accumulation of tolerances that are at the thin end of the desired tolerance.

Figure 2A:
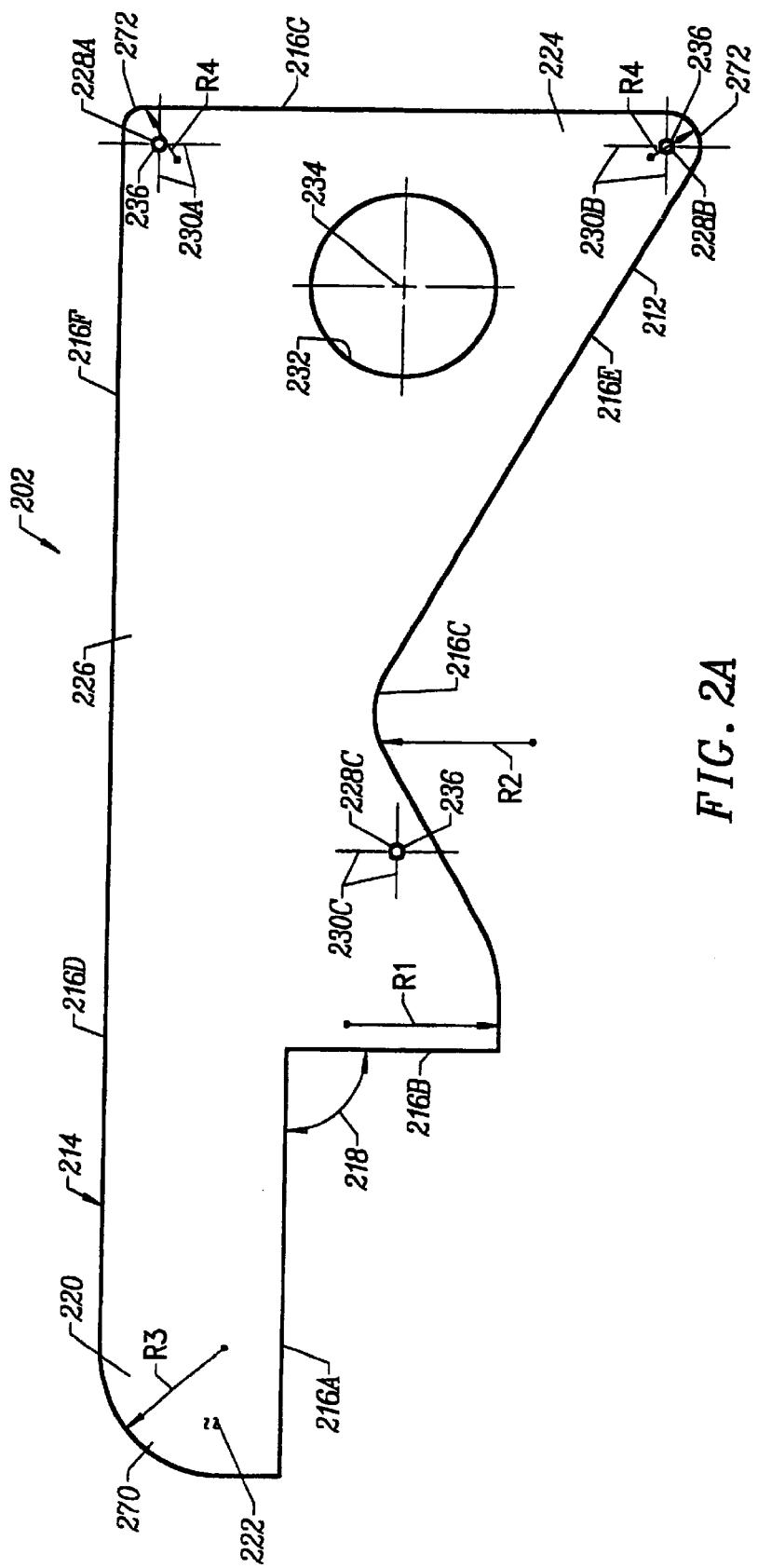
FIG. 2A is a plan view of a spatula of the present invention illustrating edges positioned relative to each other at a given angle, holes for receiving wafers pads, and an aperture dimensioned for providing a selected resonant frequency.
Figure 4A:
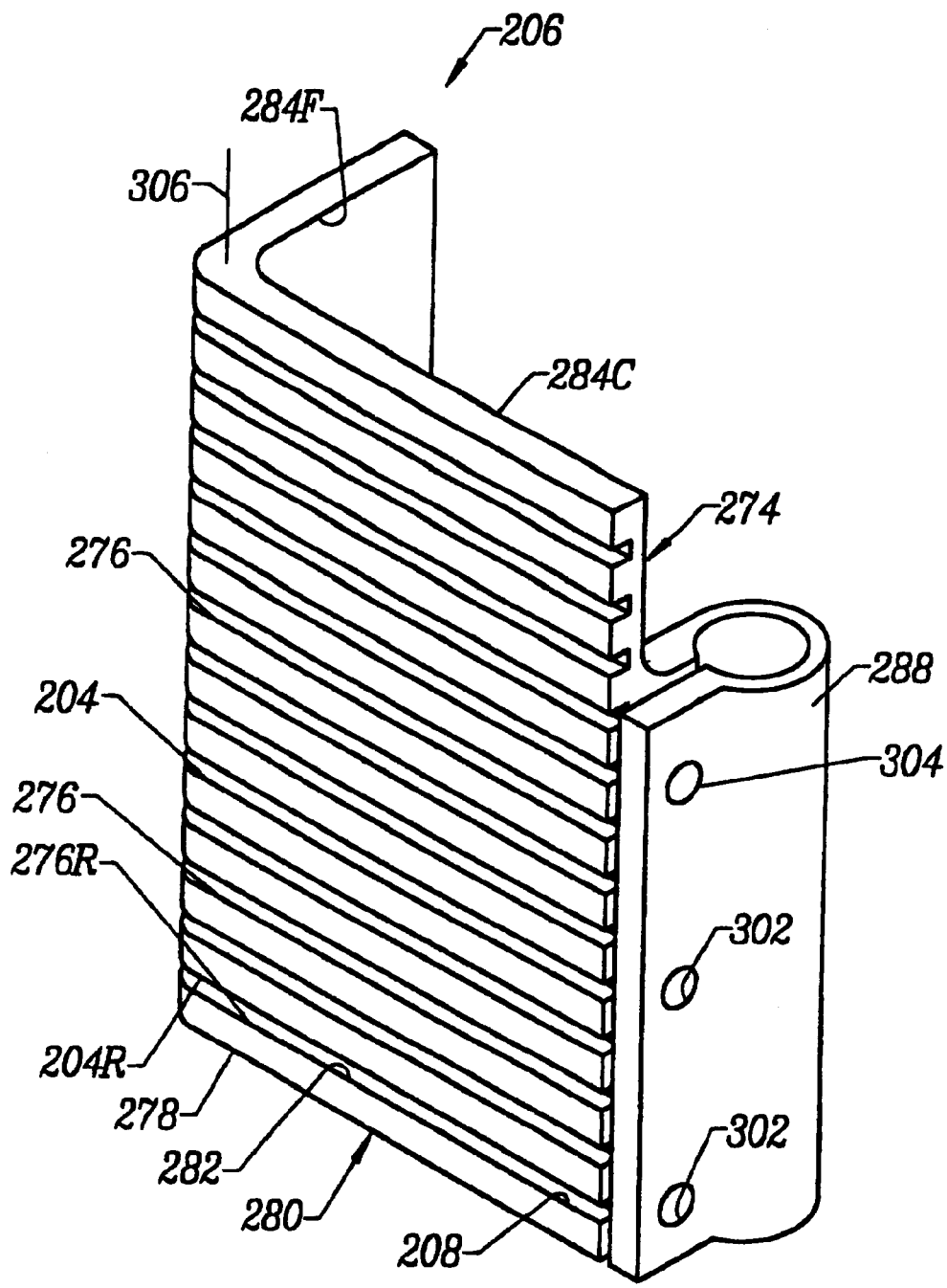
FIG. 4A is a three-dimensional view of a tower of the present invention, illustrating grooves formed in one of two walls for receiving the spatulas.
Figure 6:
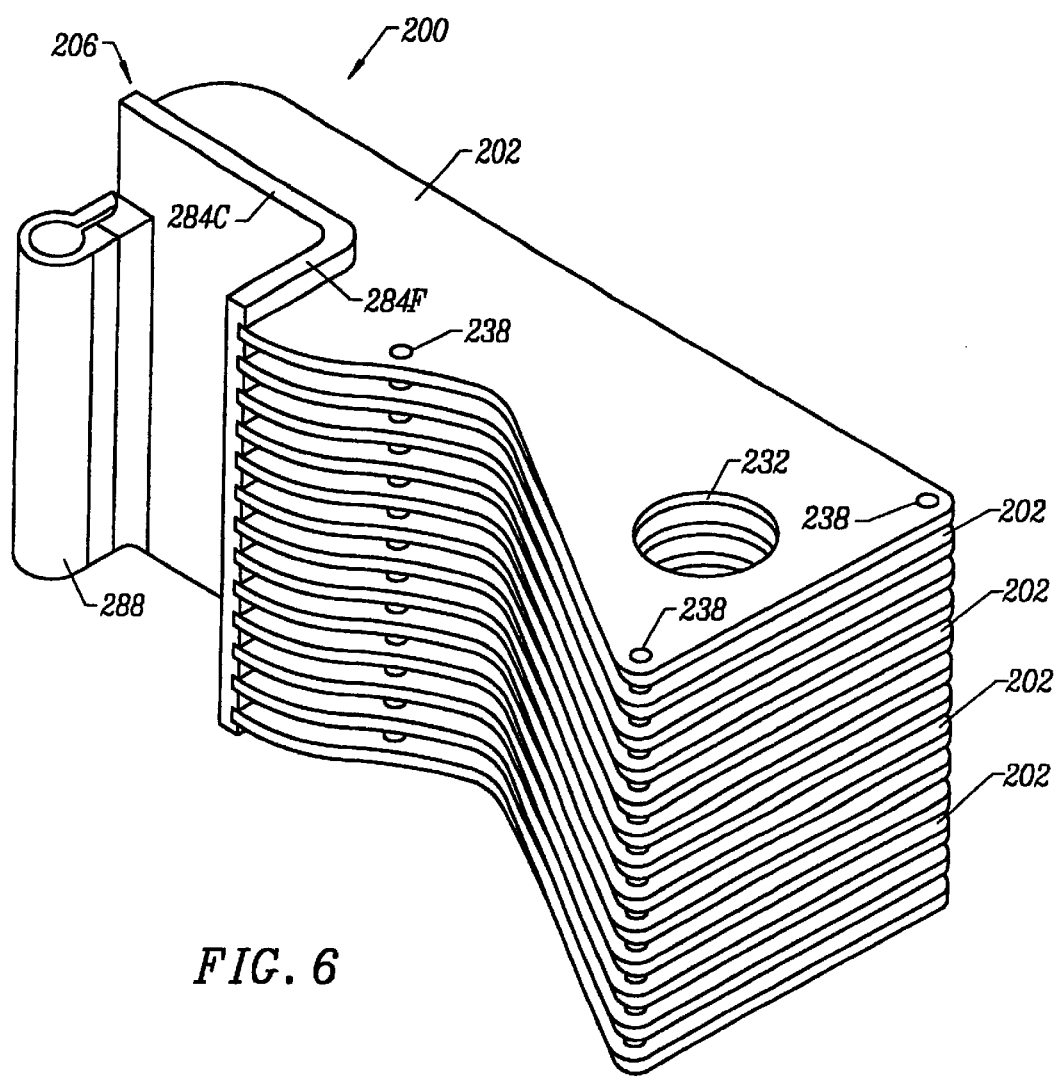
FIG. 6 is a three dimensional view of the assembled end effector, illustrating the tower secured to the plurality of spatulas.

An invention is described below for improving the efficiency of manufacture of end effectors 200 (FIG. 6), and of components of such end effectors (e.g., spatulas 202), through the implementation of ways of making grooves 204 in a tower 206 relative to a common reference surface 208 (FIGS. 2A and 4A). In the following description, numerous specific details are set forth in order to provide a thorough understanding of the present invention. It will be obvious, however, to one skilled in the art, that the present invention may be practiced without some or all of these specific details. In other instances, well known manufacturing operations have not been described in detail in order not to obscure the present invention.

FIG. 2A is a plan view of a single spatula 202 manufactured according to one embodiment of the present invention. The spatula 202 carries a piece part, such as a wafer, 210 (FIG. 2B), during semiconductor processing operations, or in the operation of material deposition systems or of flat panel display processing systems. The spatula 202 is machined from aluminum plate, for example, by a fine blanking technique well known to those skilled in the art. This technique defines a perimeter 212 having an edge 214 formed in many sections 216. A first section 216A of the edge 214 is shown intersecting a second section 216B at an angle 218. The angle 218 may, for example, be a right angle. Other sections 216C and 216D of the edge 214 extend away from the intersecting respective first and second sections 216A and 216B, and with the respective first and second sections 216A and 216B, define a mounting portion 220 of the spatula 202. The mounting portion 220 has an upper surface 222. Spaced sections 216E and 216F extend away from the mounting portion 220. A distal edge section 216G extends around a distal end 224. The sections 216E, 216F, and 216G define a portion 226 of the spatula 202 for carrying one of the wafers 210. To minimize the area of a wafer 210 that is touched during such carrying, holes 228 are provided at spaced locations, such as at points defined by center lines 230A, 230B, and 230C. Also, an aperture 232 is formed in the carrying portion 226 within an area defined by the holes 228. The aperture 232 has a diameter centered on an aperture axis 234, and each of the holes 228 has a diameter centered on a hole axis 236.

Figure 3A:
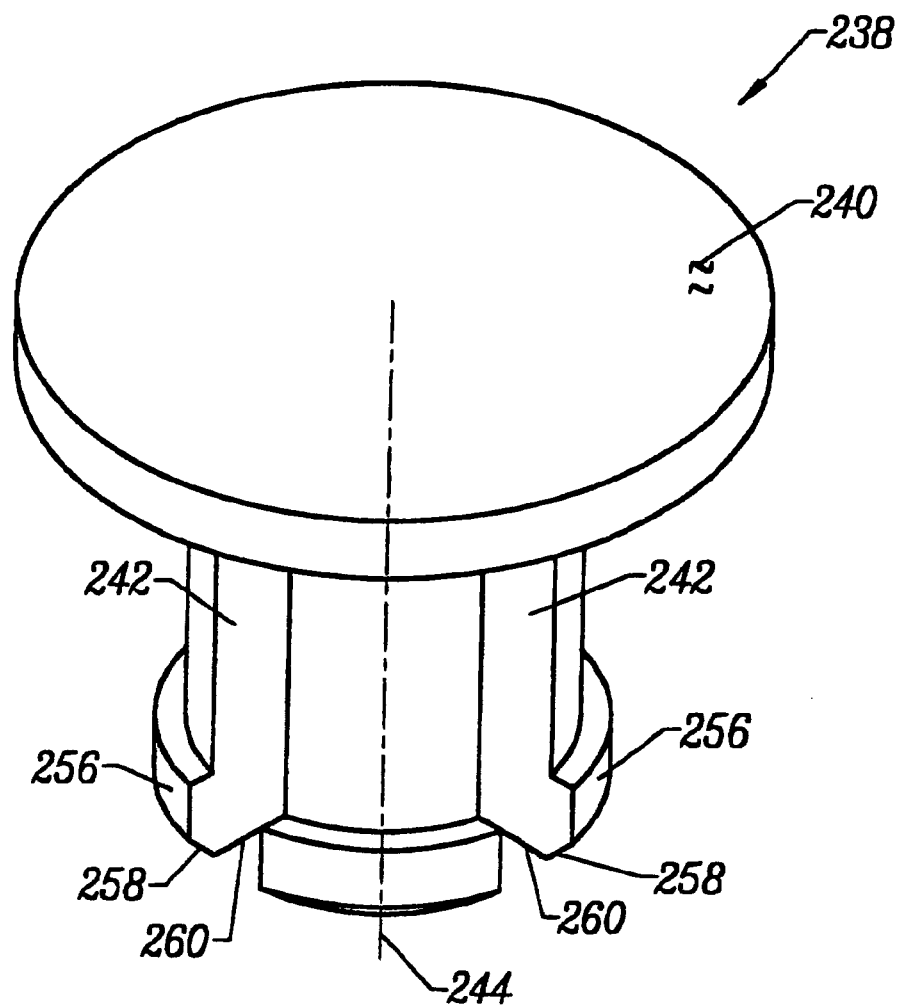
FIGS. 3A and 3B are views of the wafer pad shown in FIG. 2B, illustrating legs for retaining the pads to the spatula, and in FIG. 3B illustrating the holes for receiving the wafers pads.
Figure 3B:
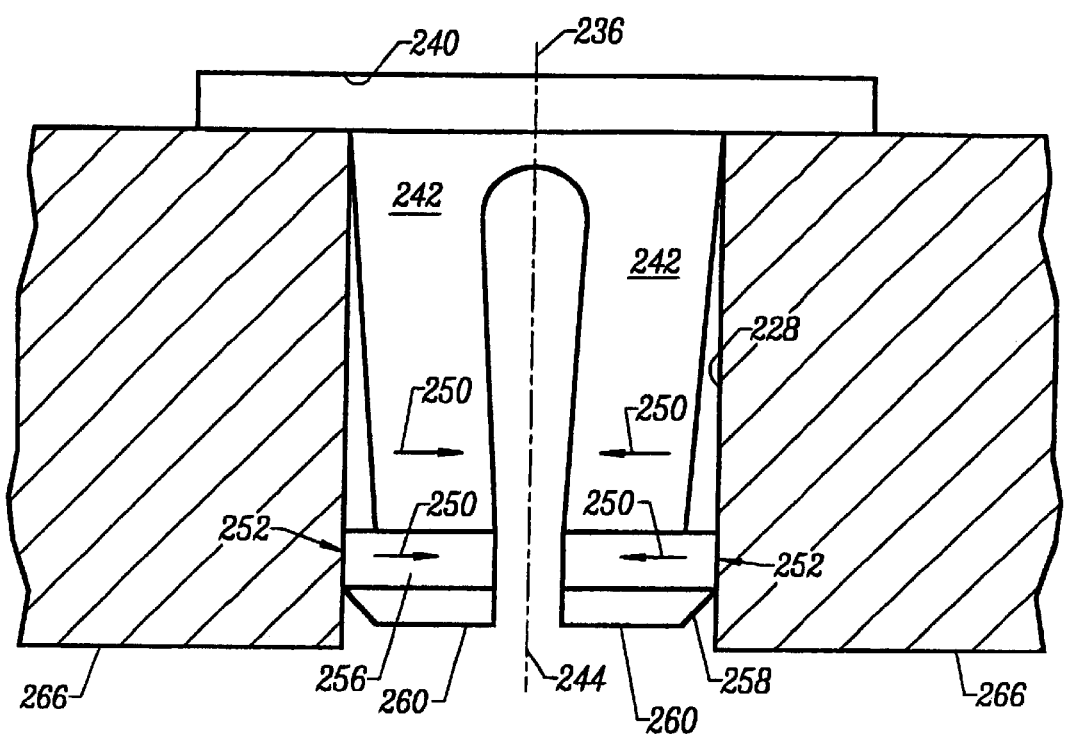

FIGS. 3A and 3B illustrate a pad 238 provided for assembly with each of the holes 228. Each of the pads 238 has a wafer support surface 240 and a plurality of legs 242 depending from the support surface 240 parallel to a leg axis 244. The wafer support surfaces 240 of the three illustrated pads 238 cooperate to provide the minimum area of the wafer 210 that is touched during the carrying of the wafer 210. To secure the pad 238 to the spatula 202, distal ends 256 are positioned within the holes 228 such that surfaces 252 are caused to contract in a direction 250 while placing a holding/friction force against the inner surface of the holes 228. To assist in inserting the pads 238 into each of the holes 228, the distal ends 256 have bevels 258. The distal ends 256 also have bottom surfaces 260 which are preferably contained within the holes 228 and above the level of surface 266 of the spatula 202.

Figure 2B:
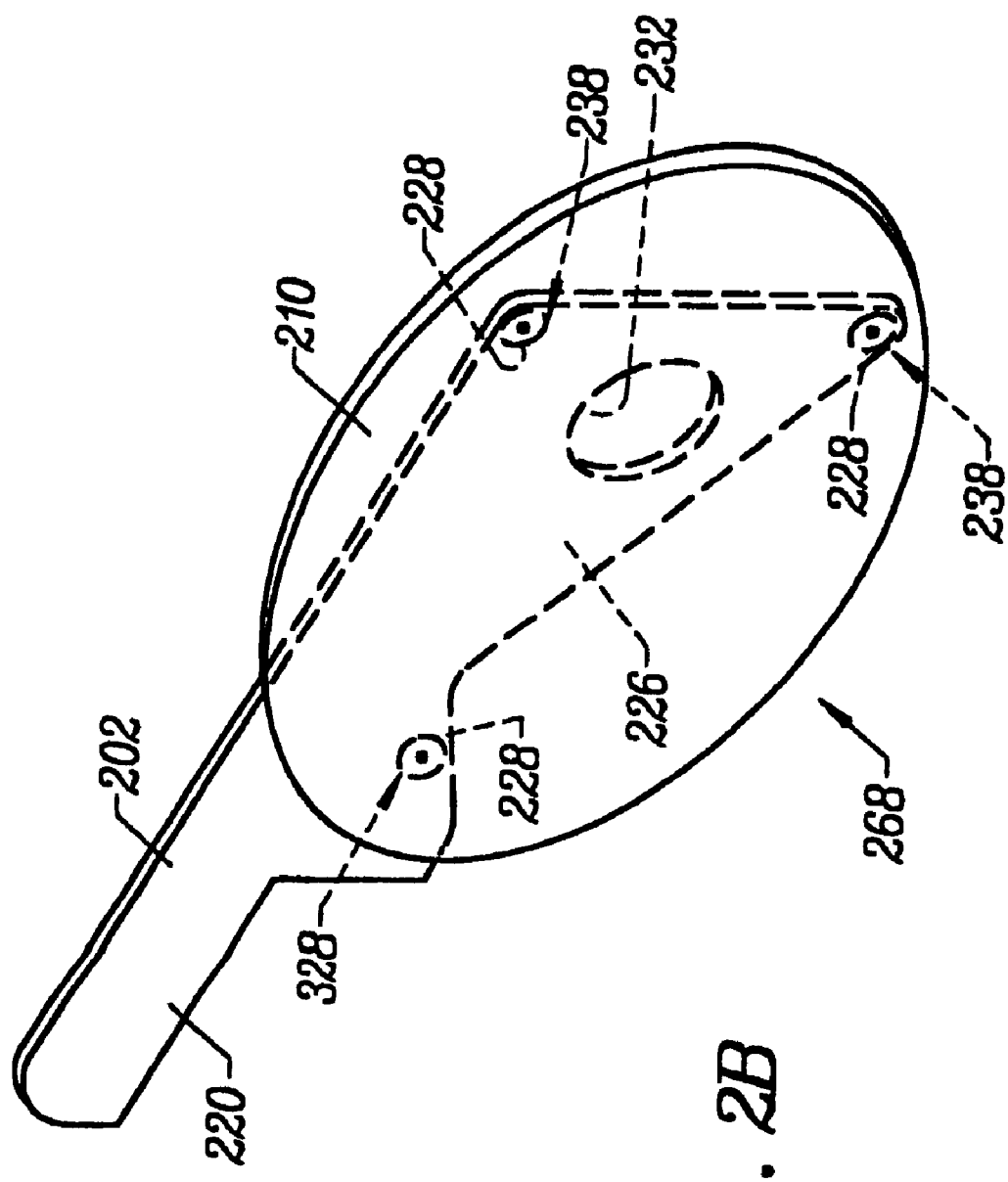
FIG. 2B is a three dimensional view of a unit including a spatula, wafer pads, and a wafer on the pads.

In the manufacture of one embodiment of the spatula 202 of the present invention, the following is recognized. Vibrations are created during semiconductor processing operations, or in the operation of material deposition systems or of flat panel display processing systems, the equipment (not shown) used for such operations or in such systems. The vibrations of the equipment are primarily in a range of frequencies, such as 35 cps to 37 cps. In such manufacture it is also recognized that a vibration unit 268 is formed by one of the spatulas 202, the three pads 238, and one of the wafers 210 carried by the three pads 238. Such a unit 268 is shown in FIG. 2B, and it is further recognized that the unit 268 will have a resonant frequency. The spatula 202, and the associated pads 238, must nonetheless carry the wafer 210 in such a manner that any vibration of the unit 268 will not cause the wafer 210 to move in response to the vibrations (e.g., walk) off the pads 238. To achieve this result, once the range of frequencies of such equipment is known, the aperture 232 is dimensioned so that the resonant frequency of such unit 268 will be out of this range. In this manner, the amplitude of the vibration of the unit 268 will be reduced, which tends to avoid walking of the wafers 210 off the pads 238. The dimensioning of the aperture 232 may, for example, use a selected diameter for a circular aperture 232, or the aperture 232 may have any other non-circular shape designed to achieve the desired resonant frequency of the unit 268. For determining the resonant frequency, in one embodiment, an accelerometer can be mounted on spatula 202, tapping the spatula, and recording the signal from the accelerometer. In this manner, the proper size and shape of aperture 232 can be predicted using finite element analysis. Once the shape and size of the aperture 232 have been selected, one of the spatulas 202 is formed with that shape and size aperture 232, and the pads 238 are assembled with the spatula 202. The unit 268, with a typical wafer 210 on the three pads 238, is mounted to a tower 206 in the manner described below. The tower 206 is mounted to a vibration table (not shown). The table vibrates the tower 206 and the unit 268 to determine that the resonant frequency of the unit 268 is out of this range. The shape and size of the aperture 232 may be adjusted as necessary to achieve the desired resonant frequency of the unit 268, which is outside of the range of vibration of the equipment.

In one embodiment of the spatula 202, the spatula 202 may be fabricated from plate aluminum, such as that meeting the standard 6061-T4 specification, for example, such that the spatula 202 is planar. Such plate aluminum may, for example, have a thickness of about 0.150 inches plus or minus 0.001 inch. Further, the carrying portion 226 may be stress relieved prior to final machining. In such embodiment, exemplary dimensions of the spatula 202 include an overall length of about eleven inches, a length of the carrying portion 226 of about 7.6 inches, and a width of the mounting portion 220 of from about 3.1 inches to about 1.6 inches. Radii of the sections 216C and 216P having curved portions may include a radius R1 of about 1.5 inches, and a radius R2 of about 0.75 inches; whereas a proximal end 270 may have a radius R3 of about 1.0 inch. Corners 272 of the spatula 202 may, for example, be arcuate having a radius R4 of about 0.3 inches. Also, the holes 228A and 228B may be located about 0.3 inches from the distal end 224. The hole 228A may be located about 0.3 inches from the section 216F, and the hole 228B may be located about 4.3 inches from the section 216F. The third hole 228C may be located about 6.06 inches from the distal end 224, whereas the aperture 232 may be about 1.46 inches from the distal end 224. The third hole 228C may be aligned with the aperture 232 at about 2.3 inches from the section 216F.

FIG. 4A illustrates the three-dimensional aspects of the tower 206 of the present invention, showing the tower 206 in a vertical position for holding components, such as the spatulas 202 shown in FIGS. 2A and 2B. The tower 206 holds the spatulas 202 accurately relative to each other, which is in the desired relative positions described above. The tower 206 may include a column 274, or other vertical member, having a plurality of the grooves 204 formed therein. Each of the grooves 204 is dimensioned to receive one of the spatulas 202 and defines a ledge 276. Thus, the plurality of grooves 204 define a plurality of ledges 276 along the column 274. The column 274 has a base 278 provided with a surface, referred to as an initial reference surface 280, which defines the location of a common reference groove 204R. The common reference groove 204R has a reference ledge 276R which defines a common reference surface 282 from which the desired relative positioning of additional ones of the grooves 204A described above is determined.

Figure 4B:
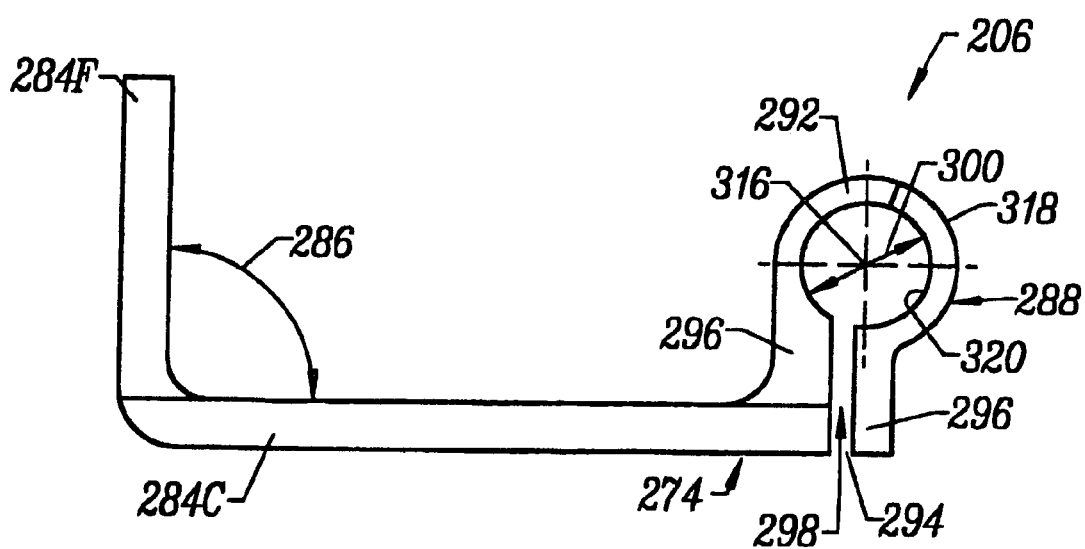
FIG. 4B is a plan view of the tower showing walls positioned relative to each other at an angle substantially the same as the given angle, and a clamp integral with one of the walls.

FIG. 4B is a plan view of the column 274 shown in FIG. 4A, illustrating the column 274 including first and second walls 284C and 284F, respectively, which extend at a selected angle 286 relative to each other. For example, the selected angle 286 of the walls 284C and 284F may be a right angle relative to each other, and such angle 286 should correspond to the angle 218 at which the first and second sections 216A and 216B of the edge 214 of the spatula 202 are positioned relative to each other. It may be understood that for spatulas 202 having first and second sections 216A and 216B positioned at a different angle 218 relative to each other, the walls 284C and 284F of the column 274 will be at a selected angle 286 corresponding to that different angle 218.

The walls 284C and 284F are shown having flat opposite sides such that each of the walls 284C and 284F is planar. The second wall 284C of the walls 284 is shown formed integrally with a device 288 for holding the tower 206 to a post 290 (FIG. 5E) or other support which may be provided in the manufacture or use of the end effector 200. The device 288 may be referred to as a clamp in that a cylindrical portion 292 of the device 288 is connected to the wall 284C and extends circularly to an opening 294. The opening 294 defines opposed flanges 296 of the cylindrical portion 292. There is a gap 298 between the opposed flanges 296 to allow the diameter 300 of the cylindrical portion 292 to be adjusted. For example, with the gap 298 wide, the cylindrical portion 292 may be placed on the post 290. Then, the gap 298 may be made smaller by drawing the flanges 296 closer to each other. Holes 302 are provided in the flanges 296 and fasteners 304 are inserted in the holes 302 to tighten the flanges 296 on the post 290 to secure the column 274 in a desired place. The first wall 284F is thus free in that it is spaced from the clamp 288. However, because of the selected angle 286 between the walls 284F and 284C, when the clamp 288 is secured to the post 290, both walls 284C and 284F remain in a stable vertical position for holding the spatulas 202 accurately and horizontally.

Figure 4C:
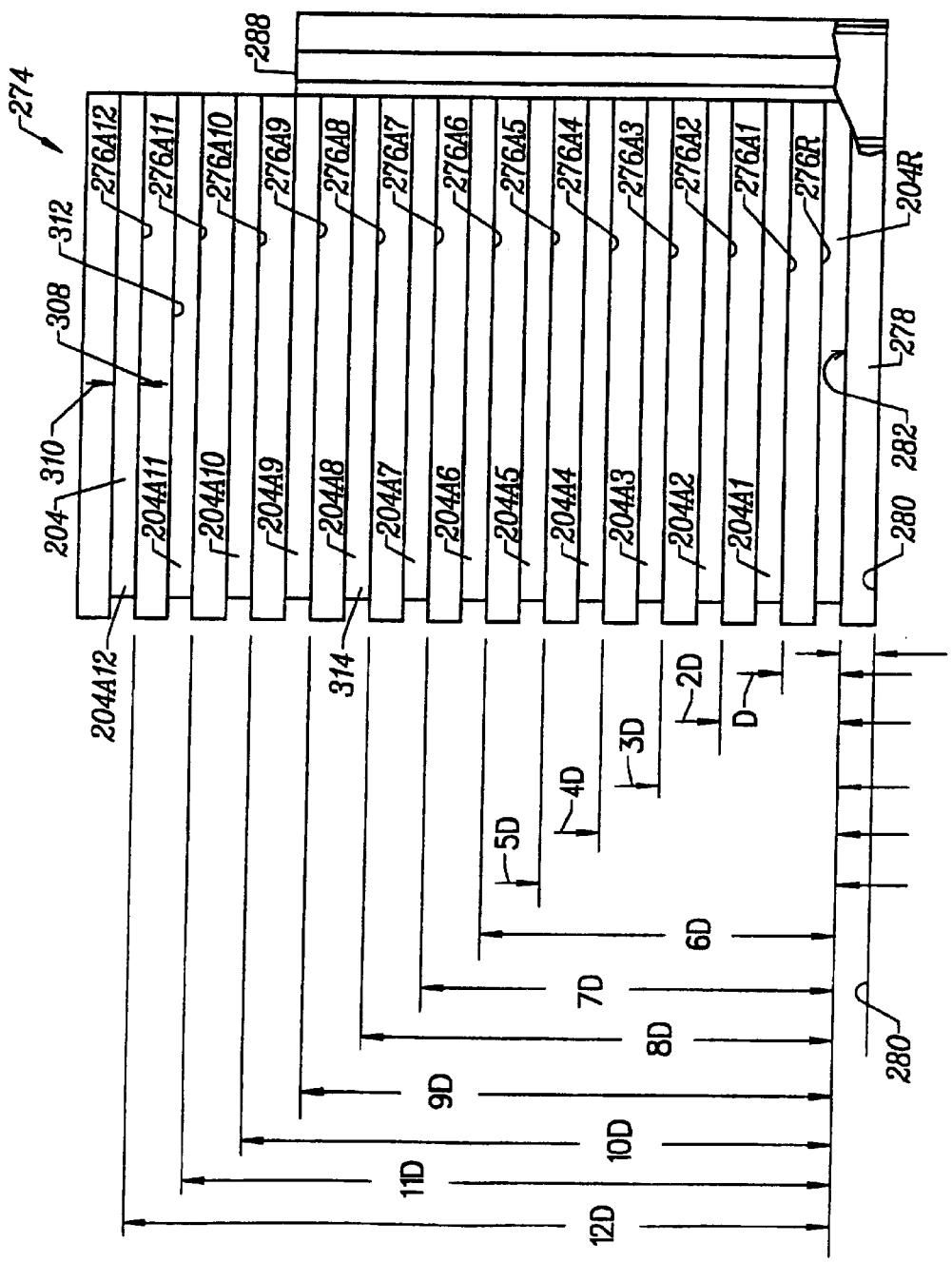
FIG. 4C is an elevational view of the tower illustrating how a reference groove is formed in the tower to define a common reference surface, and how each of a plurality of additional grooves is formed in the walls relative to the common reference surface to avoid tolerance stacking.

FIG. 4C is an elevational view of the column 274 showing the grooves 204 formed in the walls 284C and 284F. With the walls 284C and 284F intersecting along a line 306 (shown as vertical in FIGS. 4A and 4C), it is to be understood that each particular one of the grooves 204 extends horizontally across the line 306 so that each groove 204 extends continuously along the complete extent of the respective first and second walls 284F and 284C.

Each one of the grooves 204 defines one of the ledges 276, and a staking portion 308 opposite to the ledge 276. There is a space 310 defined by each of the grooves 204, an under surface 312 of each staking portion 308, and an inner end 314 of each groove 204. The space 310 has a dimension S large enough to receive the thickness of one of the spatulas 202. FIG. 4C also shows the initial reference surface 280 defined by the base 278. The walls 284F and 284C and the clamp 288 extend vertically upwardly from the initial reference surface 280.

Figure 7A:
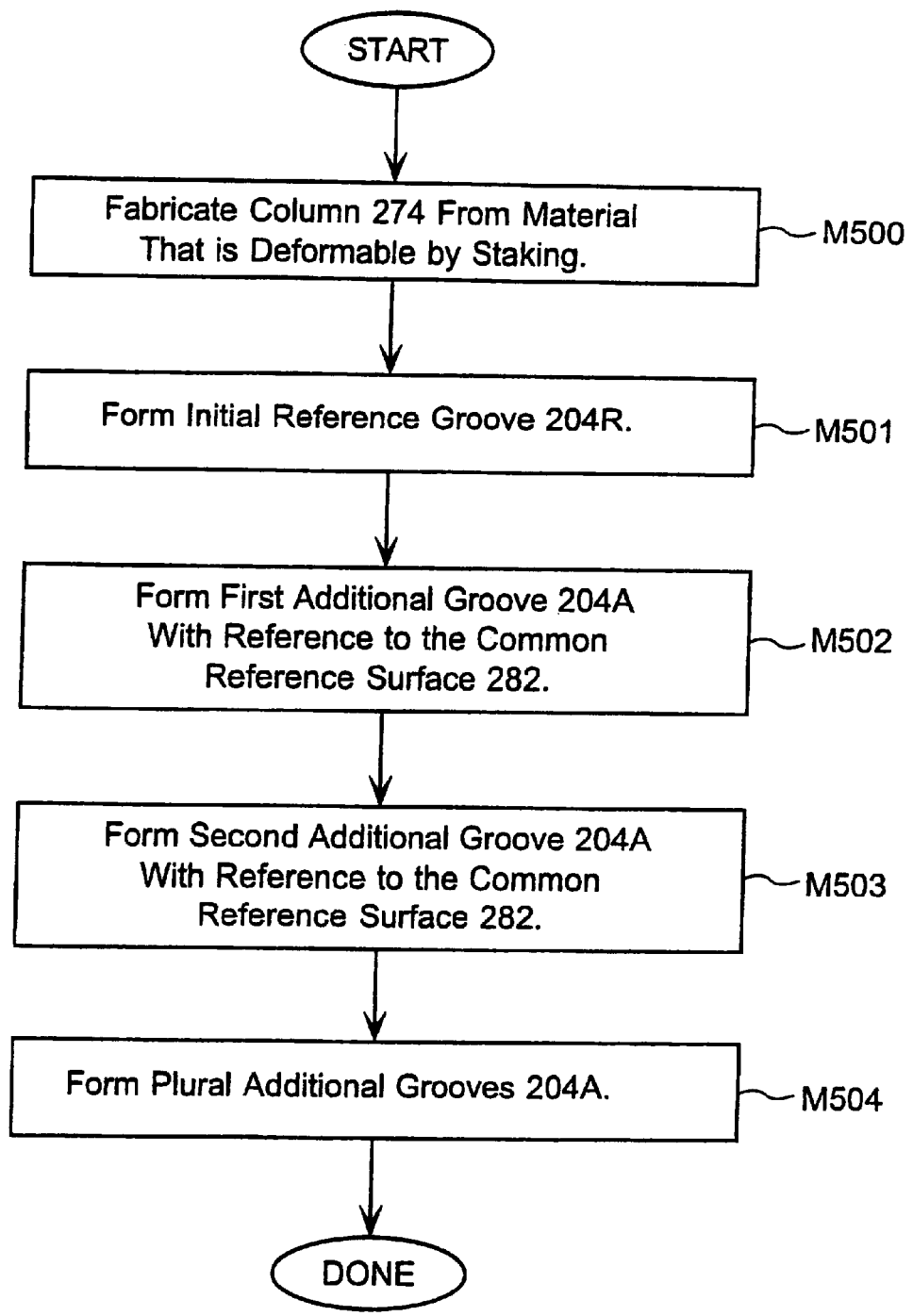
FIG. 7A is a flow chart showing the operations of one embodiment of a method of the present invention for manufacturing the tower with grooves to avoid tolerance stacking.
Figure 7B:
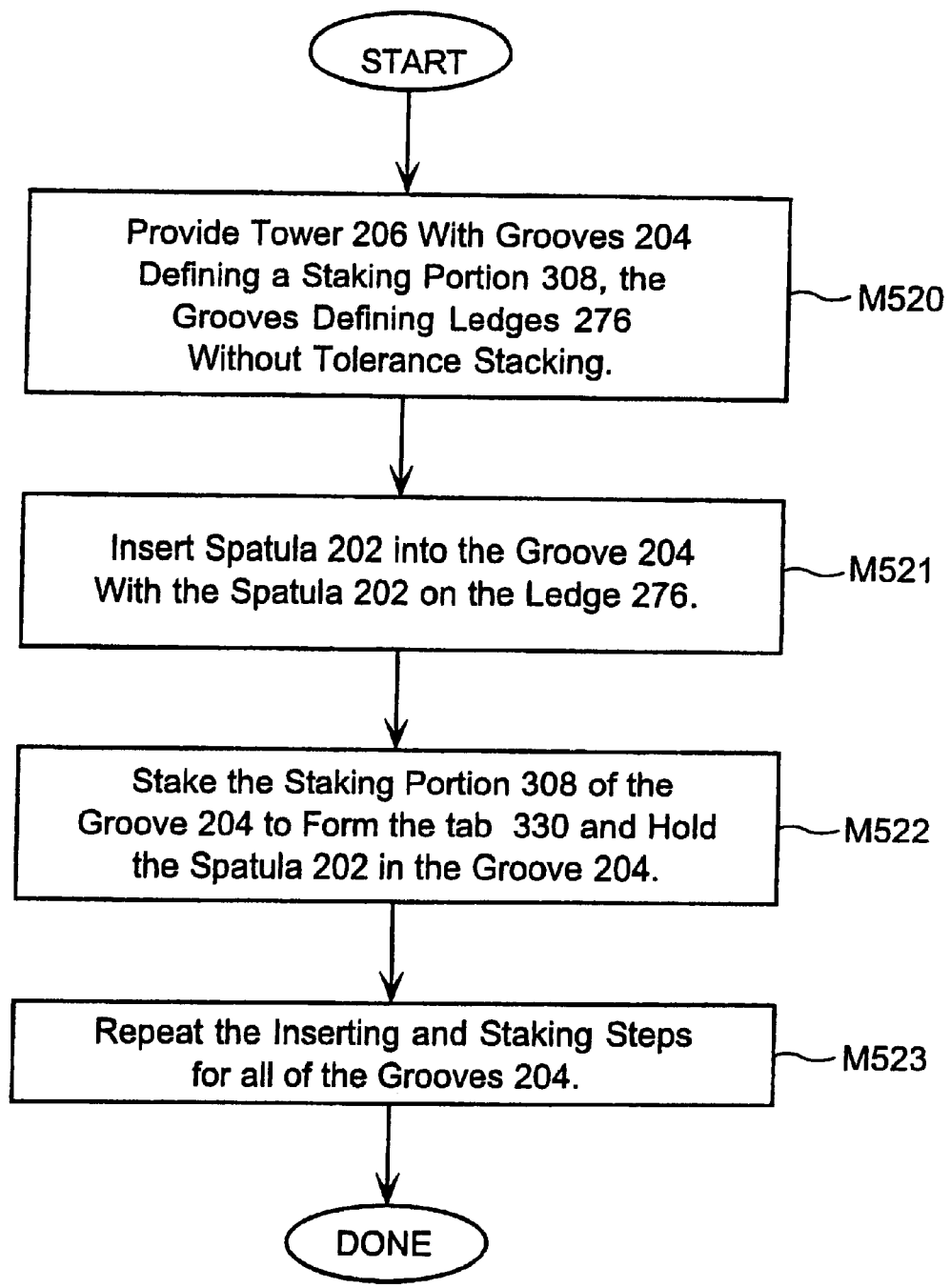
FIG. 7B is a flow chart illustrating the operations of another embodiment of a method of the present invention where a plurality of spatulas are positioned without tolerance stacking and the spatulas are secured to the tower by staking operations.

One embodiment of a method of the present invention relates to making the tower 206 for holding the components (e.g., the spatulas 202) of the end effector 200, wherein the spatulas 202 are to be accurately held relative to each other. This embodiment is described in FIG. 7A. Referring to FIG. 7A, this embodiment of the method includes an operation M501 of forming the initial reference groove 204R in the walls 284. The initial reference groove 204R is made by measuring from the initial reference surface 280 a distance equal to the thickness (or height) of the base 278. At that distance, the reference groove 204R is formed, as by grinding, for example. The reference groove 204R defines the ledge 276, which is referred to as the common reference ledge 276R. The common reference ledge 276R provides the common reference surface 282 for making additional ones of the grooves 204A and their respective additional ledges 276A.

Still referring to FIG. 7A, this embodiment of the method includes a further operation M502 of forming a first additional groove 204 in the walls 284. The first additional groove 204 is dimensioned to receive another one of the spatulas 202 and defines a first additional ledge 276A1. As shown in FIG. 4C, the distance from the common reference surface 282 to any one of the additional ledges 276A is either a specified amount, referred to as D (e.g., for the first additional ledge 276A1), or a multiple of D (e.g., for the remainder of the additional ledges 276A).

Still referring to FIG. 7A, this embodiment of the method includes a further operation M503 of forming a second additional groove 204A2 in the walls 284. The second additional groove 204A2 is also dimensioned to receive another one of the spatulas 202 and defines a second additional ledge 276A2.

It may be understood that this embodiment of the method includes performing each of the additional groove forming operations M502 and M503 to provide the first additional ledge 276A1 spaced by the selected distance D from the common reference surface 282 and to provide the second additional ledge 276A2 spaced from the common reference surface 282 by a multiple of the selected distance D. As a result, the first additional ledge 276A1 and the second additional ledge 276A2 are evenly and accurately spaced from the common reference surface 282 and from each other.

This embodiment of the method may be continued by performing an operation M504 of forming a plurality of the second additional grooves 204A in the walls 284 as described above (e.g., additional grooves 204A3 to 204AN, where N exceeds 3). In this situation, the multiple of the selected distance D is increased by one for each of the plurality of second additional grooves 204A.

In more detail, and still referring to FIG. 4C, this embodiment of the method provides the first additional ledge 276A1 of the additional ledges 276A spaced by the selected distance D from the common reference surface 282 defined by the reference ledge 276R. Also, a plurality of the successive additional ledges 276A2 through 276A12 are, for example, shown spaced from the common reference surface 282 by a uniformly increasing multiple of the selected distance D. In this manner, the plurality of additional ledges 276A2 through 276A12 are evenly and accurately spaced from the common reference surface 282 at which the reference ledge 276R is located, and from each other. The amount of the uniformly increasing multiple of the selected distance D may be 1, for example, so that the distance of the first additional ledge 276A1 from the common reference surface 282 is D, and the distance of the second additional ledge A2 from the common reference surface is 2 times D, and the distance of the third additional ledge 276A3 from the common reference surface 282 is 3 times D, and the distance of the ledge 276A12 from the common reference surface 282 is 12 times D, for example.

The number of grooves 204 to be provided in any particular wall 284 depends on the number of spatulas 202 which need to be used to carry all of the wafers 210 contained in any given one of the cassettes 110. In one embodiment of the present invention, up to twenty-five grooves 204 may be provided in the walls 284. It may be appreciated that the advantages of the present invention become more significant with increases in the number of wafers 210 to be carried. In more detail, because there is no tolerance stacking of the additional ledges 276A formed in the walls 284, only one tolerance is involved between any given additional ledge 276A and the common reference surface 282. In contrast, as is clear from the above description of FIG. 1D, with each increase in the number of wafers 210 to be carried by the prior art end effectors 112, each prior art spacer 120 and each prior art spatula 118 presents another opportunity for introducing an increase in the amount of error in the actual relative positioning of the spatulas 118 as compared to the desired relative positioning.

In one embodiment of the tower 206, the tower 206 may be fabricated from 6061-T4 aluminum alloy. Such aluminum alloy may have a thickness of about 0.25 inches. Further, the tower 206 may be stress relieved prior to final machining. In such embodiment, exemplary dimensions of the tower 206 include the following. There may be provided an overall height of about 5.3 inches, a length of the wall 284C of about 3.5 inches, a length of the wall 284F of about 1.8 inches, and a distance of about 0.975 inches from the outside of the wall 284C to the centerline 316 of the clamp 288. The clamp 288 may be about four inches high, for example. The diameter of an outer wall 318 of the clamp 288 may be 0.875 inches, and the diameter of an inner wall 320 of the clamp 288 may be 0.625 inches, for example. The centerline 316 of the clamp 288 may be about 3.65 inches from the wall 284F. The grooves 204 may be 0.125 inches deep (perpendicular to the plane of a wall 284) for example. The height of each of the grooves 204 may be 0.153 inches plus or minus 0.001 inch. In this manner, the spatulas 202 having the above identified exemplary thicknesses of about 0.150 inches may be received in the grooves 204.

The common reference ledge 276R may be spaced from the initial reference surface 280 by 0.25 inches plus or minus 0.001 inch. The distance D from the common reference ledge 276R to the first additional ledge 276A1 may be 0.3937 inches plus or minus 0.0020 inches. As described above, the distance from the common reference ledge 276R to the second additional ledge 276A2 may be 2 times 0.3937 inches (or 0.6874 inches) plus or minus 0.0020 inches. Thus, 2 is the multiple. As described above, there is a uniform increase in the value of the multiple from one additional ledge 276A to another additional ledge 276A. For example, the third additional ledge 276A3 is made with reference to 3 times 0.3937 inches (plus or minus 0.0020 inches) measured from the common reference surface 282 defined by the reference ledge 276R. Similarly, the fourth additional ledge 276A4 is made with reference to 4 times 0.3937 inches (plus or minus 0.0020 inches) measured from the common reference surface 282 defined by the common reference ledge 276R. It may be understood then that if there are N additional grooves 204, the Nth additional groove 204 will be made with reference to N times 0.3937 inches (plus or minus 0.0020 inches) measured from the common reference surface 282.

Figure 5A:
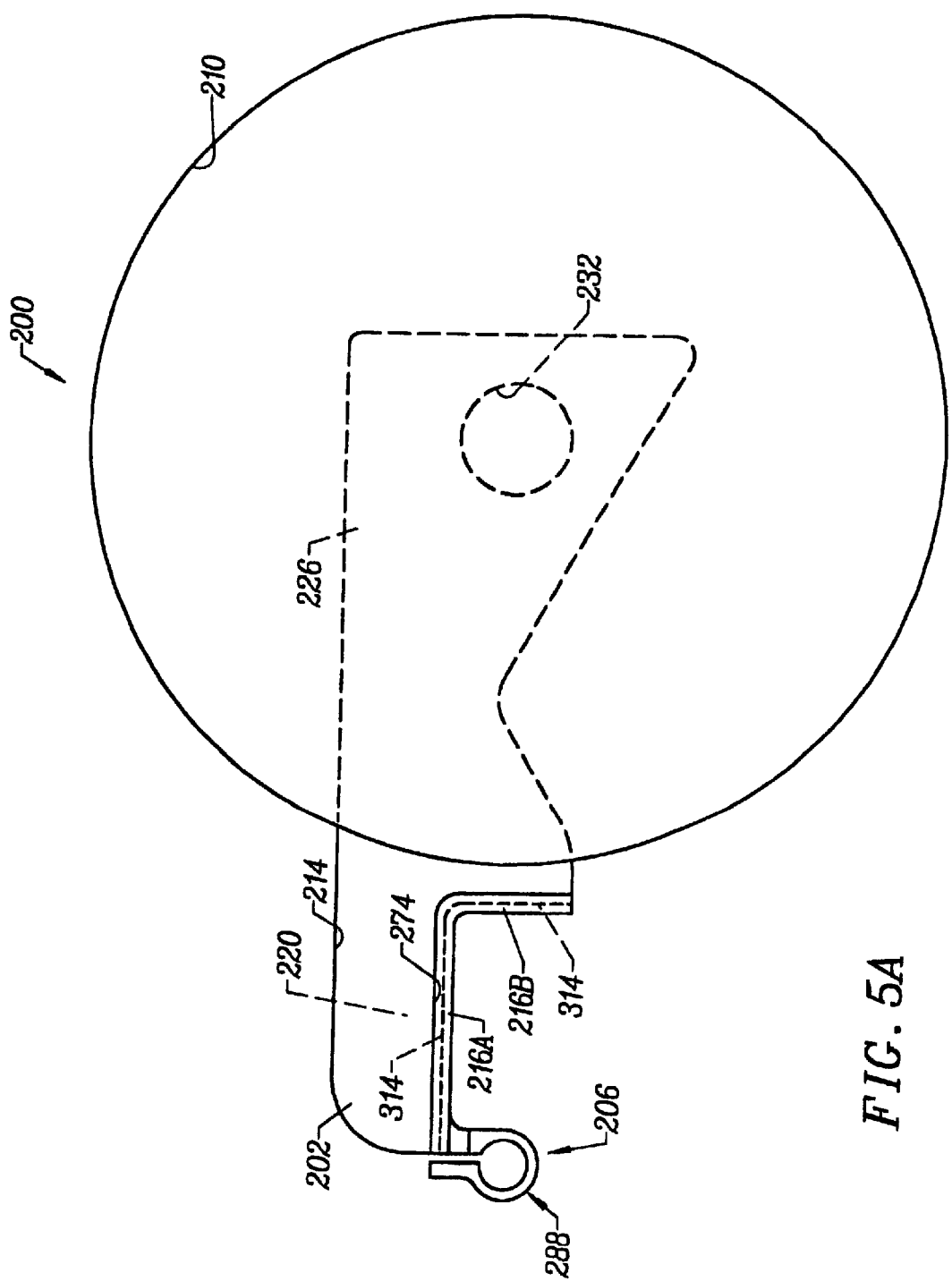
FIG. 5A is a plan view of the end effector of the present invention illustrating the tower assembled with one of the spatulas and a wafer supported on the spatula.
Figure 5B:
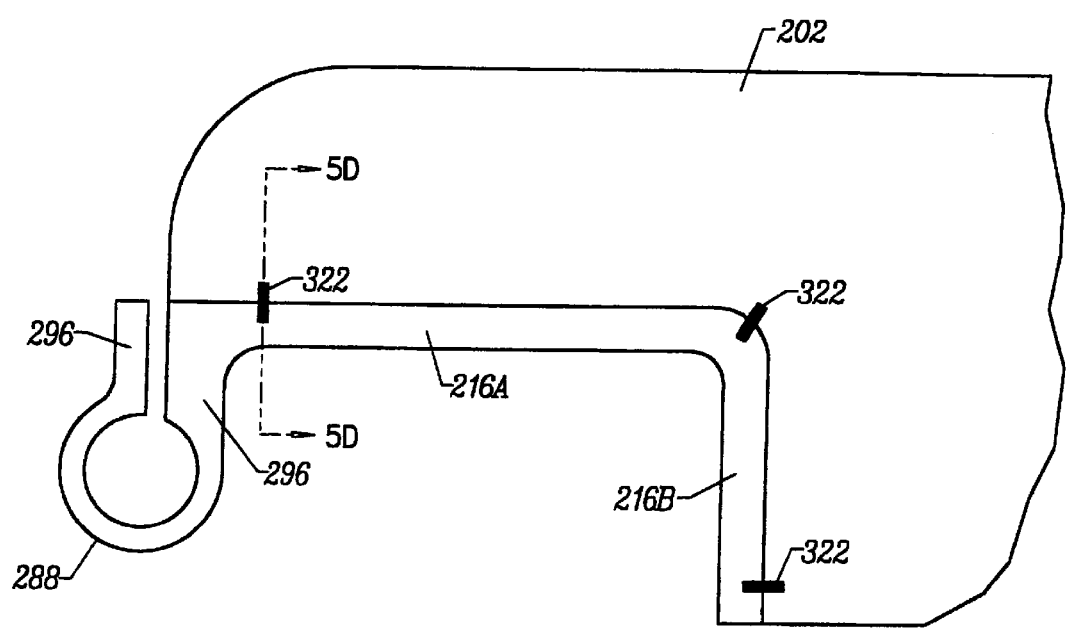
FIG. 5B is an enlargement of a portion of the end effector shown in FIG. 5A, illustrating the locations at which a staking operation is performed to secure a spatula to the walls of the tower.
Figure 5C:
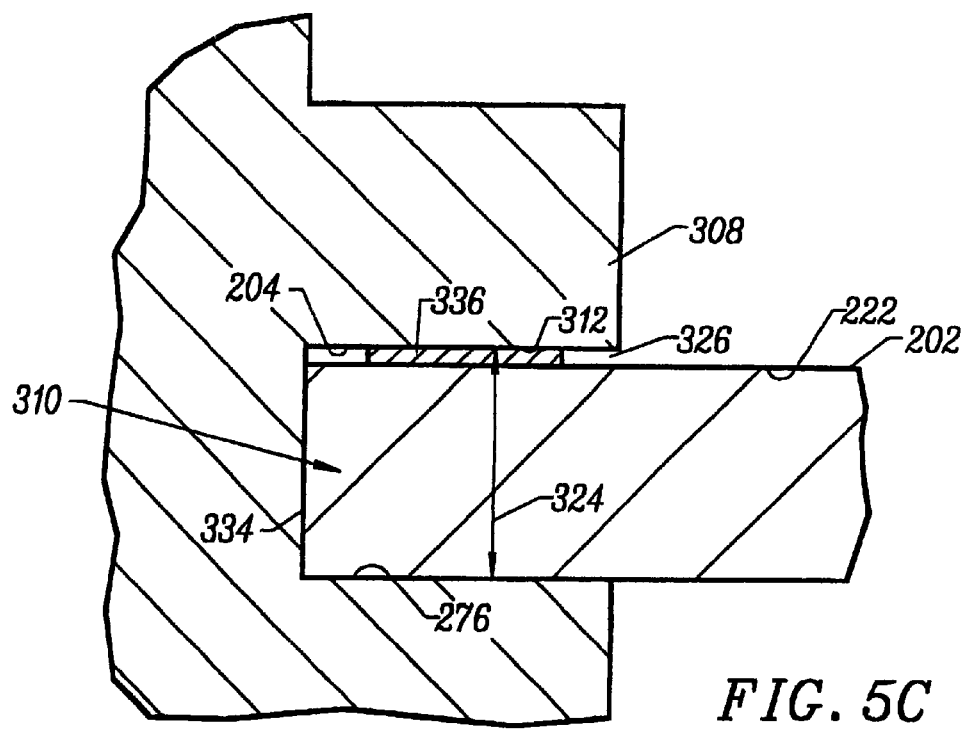
FIG. 5C is an enlarged elevational view illustrating a spatula received in one of the grooves and resting on a ledge, where a space is illustrated between the upper surface of the spatula and the upper portion of the groove prior to the staking operation.
Figure 5D:
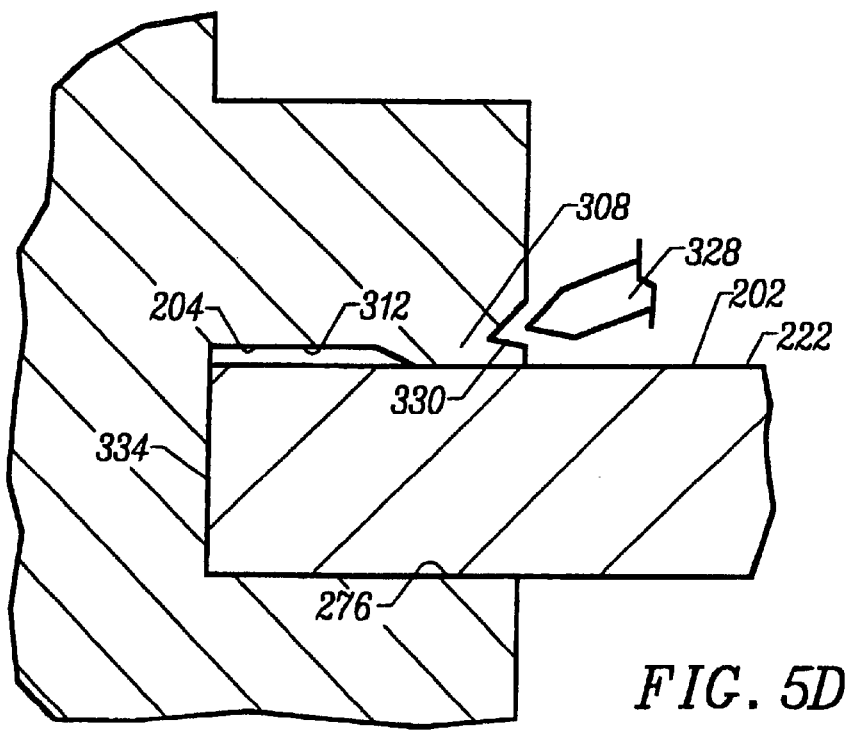
FIG. 5D is a view similar to FIG. 5C after the staking operation has been performed, illustrating deformation of a staking portion into contact with the upper surface of the spatula to hold the spatula against the ledge.

FIG. 5A is a plan view of the end effector 200 of the present invention illustrating the tower 206 assembled with one of the spatulas 202. For illustration purposes, the center of a wafer 210 is shown being concentric with the center of aperture 232. Although any size or shape substrate may be carried by the spatulas of the end effector 200, preferably circular-type wafers, such as a 300 mm (11.811 inch) wafer is carried by each of the spatulas 202. The first and second sections 216A and 216b of the edge 214 of the spatula 202 are shown conforming to the shape of the inner ends 314 (FIG. 5A) of the grooves 204. FIG. 5B shows an enlargement of a portion of the assembled tower 206 and the spatula 202 and illustrates a plurality of locations (each indicated by a short line 322) at which a staking operation is performed. FIG. 5C is a cross section illustrating the process of assembly of the tower 206 with a spatula 202. The spatula 202 is illustrated in the groove 204. FIG. 5D shows the result of performing the staking operation to secure the spatula 202 in one of the grooves 204. FIG. 5C illustrates one of the three locations 322 (shown in FIG. 5B) as having the staking operation performed. It may be understood that the one embodiment of the method of the present invention may include an initial additional operation M500 of fabricating the column 274 from material that is deformable by staking to reduce the height 324 of the space 310 of the grooves 204. This operation M500 is achieved by using the plate aluminum for the tower 206 as described above.

Referring again to FIG. 5C, one of the grooves 204 is shown defining the staking portion 308, which is above the ledge 276 of the groove 204. Because of the height 324 of the space 310 of the groove 204, prior to performing a staking operation, there is the space 326 between the upper surface 222 of the spatula 202 and the under surface 312 of the groove 204. FIG. 5D is similar to FIG. 5C, but differs in that FIG. 5D illustrates the staking portion 308 after the staking operation has been performed by using a staking tool 328. The staking tool 328 shown in FIG. 5D is used to deform the staking portion 308 to define a tab 330 that is formed to press (as viewed in FIG. 5D) against the upper surface 222 of the spatula 202 that is in the groove 204. The tab 330 urges the spatula 202 down (as viewed in FIG. 5D) against the ledge 276. The strength of the staking portion 308 is such that the tab 330 remains in the position shown in FIG. 5D so as to hold the spatula 202 against the ledge 276.

Referring to FIGS. 4B, 5C, 5D, 5E and 7B, another embodiment of the method of the present is illustrated. An operation M520 is for providing the tower 206 with a plurality of the grooves 204. Each of the grooves 204 defines one of the ledges 276 and the staking portion 308 opposite to the ledge 276. Respective ones of the ledges 276 are spaced from the common reference surface 282 by the selected distance D, for example, and a multiple of the selected distance D to provide the grooves 204 and the ledges 276 without tolerance stacking. An operation M521 is for inserting the first edge 334 of the spatula 202 into one of the grooves 204 with the spatula 202 on the ledge 276 of the one groove 204. An operation M522 is for staking the staking portion 308 of the one groove 204 to hold the inserted first edge 334 of the spatula 202 against the ledge 276 of the one groove 204.

Further operations may be taken to complete the tower 206, as by the following. The insertion operation M521 may be performed one-by-one starting from the bottom of the base 278 and first inserting a spatula 202 in the reference groove 204R. One of the tabs 330 shown in FIG. 5D is formed. Then, the next upward spatula 202 is inserted into the next upward groove 204, which defines the first additional ledge 276A1. Another one of the tabs 330 shown in FIG. 5D is formed. This series of insertion operation M521 and staking operation M522 may be repeated until all of the spatulas 202 have been inserted into all of the grooves 204 and all of the staking portions 308 have been staked.

Figure 7C:
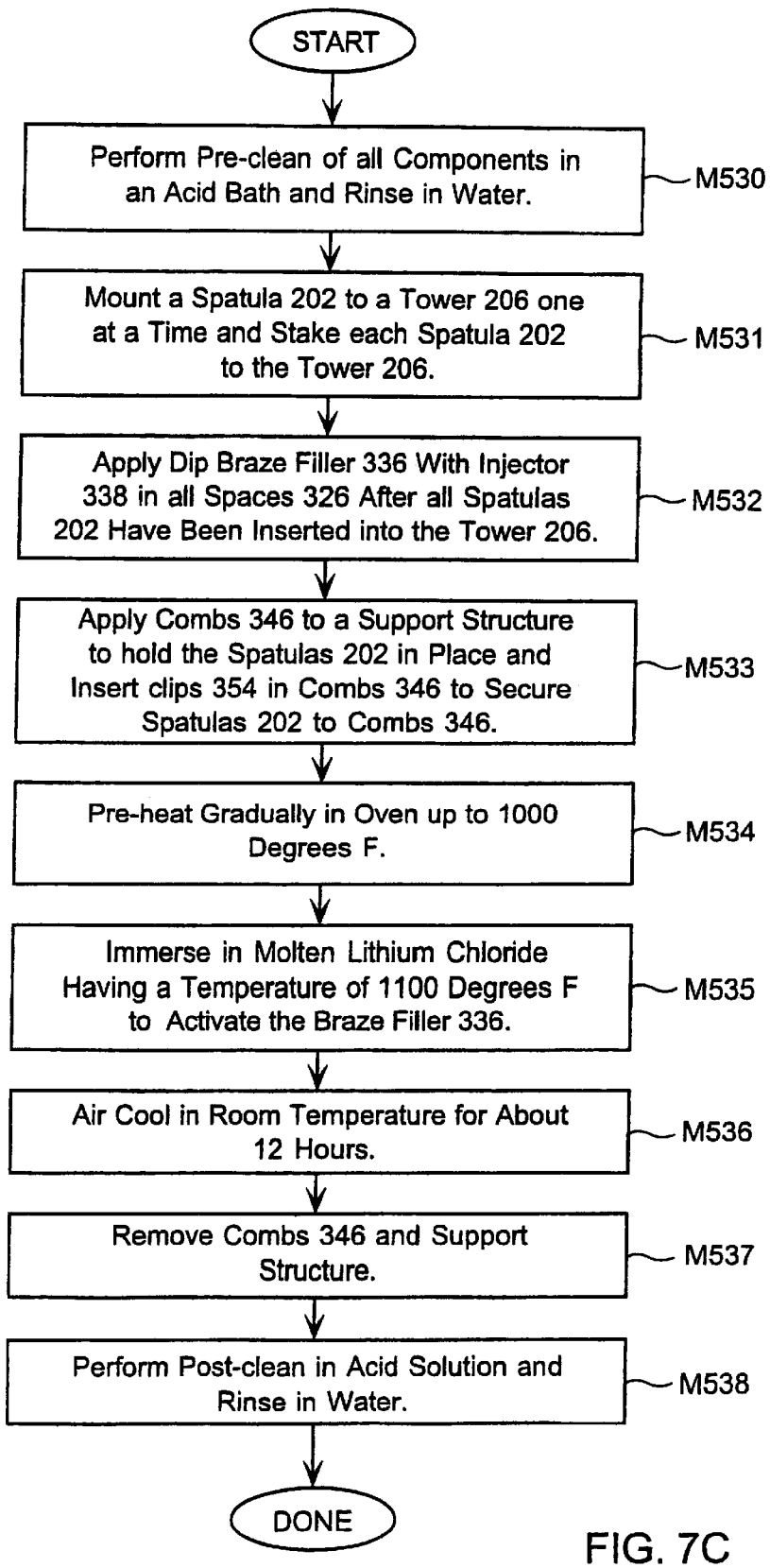
FIG. 7C is a flow chart illustrating the operations in the assembly of the end effector of the present invention by joining the tower with spatulas, wherein heating and brazing operations follow joining the spatulas to the tower by the staking operations.

FIG. 7C describes another embodiment of a method of the present invention. In an operation M530, pre-cleaning of all of the components of the end effector 200 and of the parts for brazing (e.g., the brazing fixture 346 and the clips 354 is performed. The pre-cleaning is in an acid solution. Then such components and parts are rinsed in water. Then, an operation M531 may be performed to mount a spatula 202 to a tower 206 one-at-a-time. Each spatula 202 is staked to the tower 206.

Having inserted all the spatulas 202 into all of the grooves 204, and having staked all of the staking portions 308, it may be understood that except at the locations 322 at which the staking operation has been performed, the grooves 204 that have received the spatulas 202 still have the space 326 between the under surface 312 and the upper surface 222 of the spatula 202 as shown in FIG. 5C.

M532 is the next operation of this embodiment of the method of the present invention, in which a dip brazing filler 336 (FIG. 5C) is applied into each of the spaces 326 between the upper surfaces 222 and the under surfaces 312. To apply the brazing filler 336, the filler 336 is provided in an injector 338, which may be syringe-like having a long hollow needle 340. As described in FIG. 7C, and with reference to FIG. 5E, the needle 340 is inserted into a space 342 between one pair 344 of the spatulas 202. The needle 340 extends to the space 326 shown in FIG. 5C. The injector is then operated to discharge the brazing filler 336 into the space 326 along the entire extent of one of the grooves 204. This process is repeated with the next space 342 between the next pair 344 of spatulas 202 until all of the spaces 326 in all of the grooves 204 have been filled with the brazing filler 336.

Figure 5E:
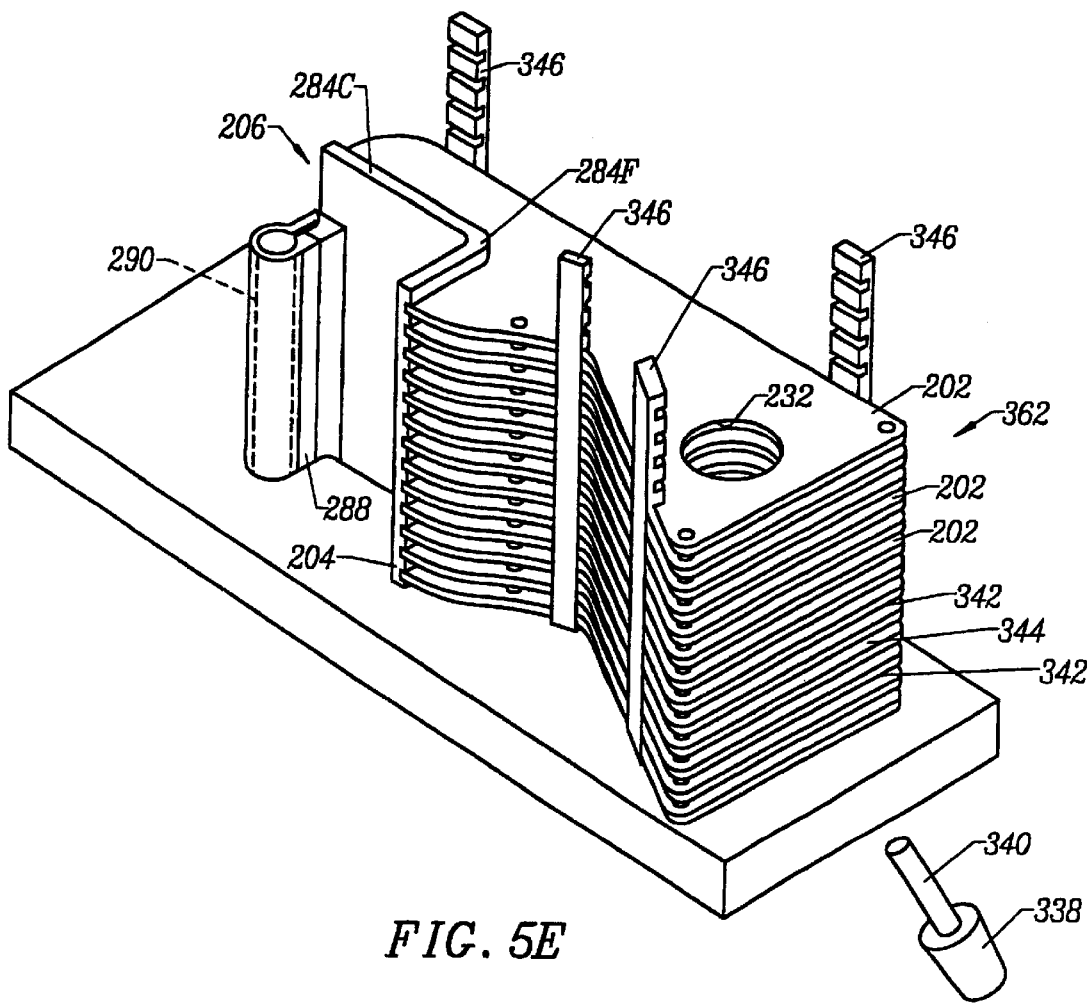
FIG. 5E is a three-dimensional view of the end effector shown in FIG. 5A, illustrating a plurality of spatulas secured to the tower and welding fixtures removably attached to the spatulas for holding the spatulas in position during brazing.
Figure 5F:
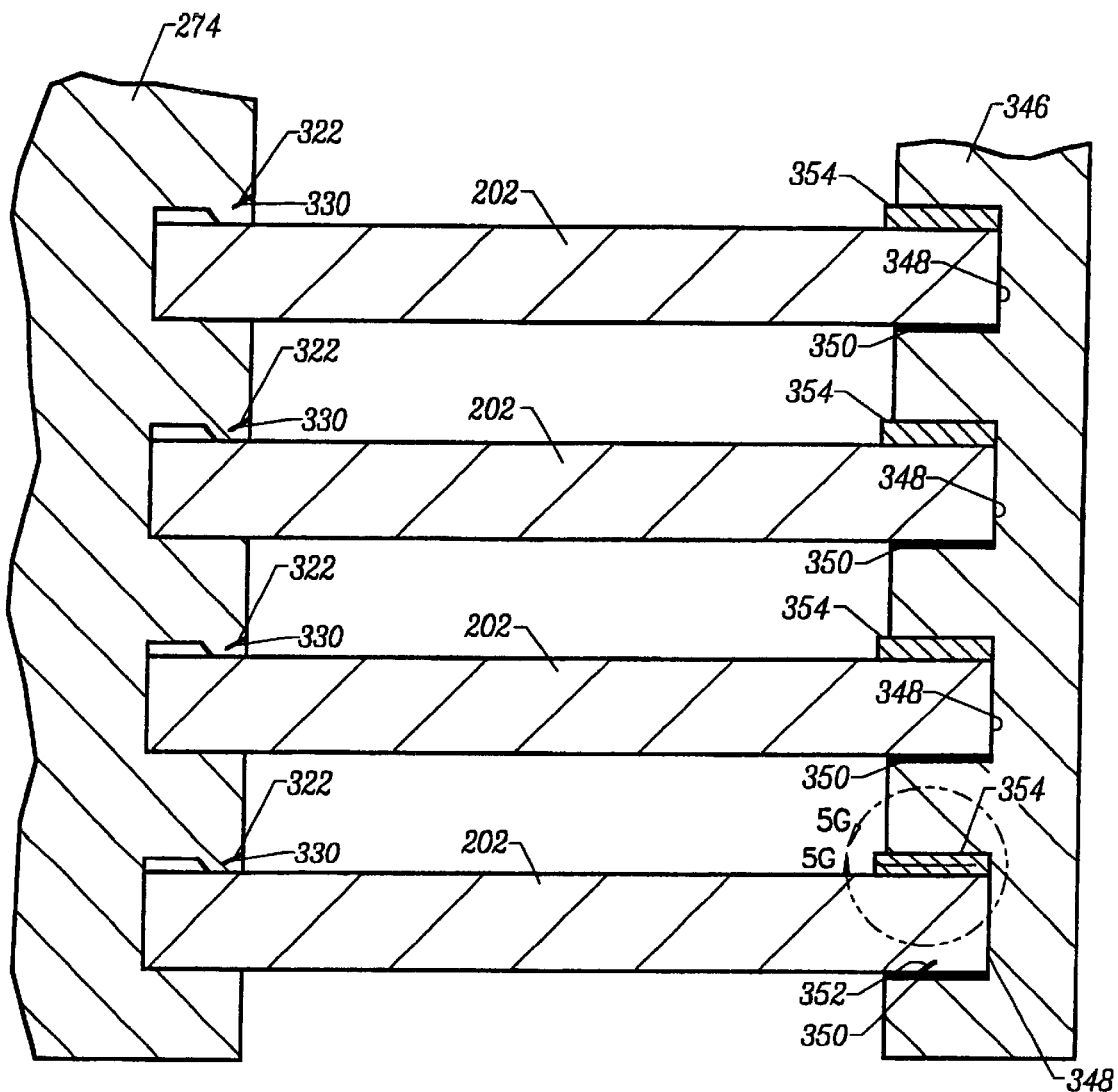
FIG. 5F is an elevational view illustrating fixturing of the end effector using a plurality of combs.

At this juncture, the tower 206 is in the condition shown in FIG. 5F, except for four brazing fixtures (or combs) 346 that are shown in FIG. 5F. In detail, the mounting portion 220 of each of the spatulas 202 is held in place in the respective groove 204 by the three tabs 330 (FIG. 5B), such that the carrying portion 226 is cantilevered from the mounting portion 220. Also, the brazing filler 336 is in all of the spaces 326.

FIG. 5E illustrates the four brazing fixtures 346, with three shown located adjacent to the carrying portion 226 and one located adjacent to the mounting portion 220. Referring to FIG. 5F, each of the brazing fixtures 346 is provided with a plurality of slots 348. Each of the slots 348 defines an edge support 350 on which one of the spatulas 202 rests. The slots 348 are formed in the brazing fixtures 346 in the same manner as the grooves 204 are formed. As a result, after a reference slot 348R is formed and defines a common fixture reference surface 352, additional slots 348 are formed so that respective ones of the edge supports 350 are spaced from the common fixture reference surface 352 by the same selected distance D and the same uniformly increased multiple of the selected distance D to provide the slots 348 and the edge supports 350 without tolerance stacking.

In an operation M533, the brazing fixtures (or combs 346) are used to fixture the tower 206, which is by applying the combs 346 to hold the spatulas 202 in place. The fixturing supports the carrying portion 226 and the mounting portion 220 of the each of the spatulas 202 for a brazing operation. For this purpose, operation M533 may include positioning the brazing fixtures as shown in FIG. 5E adjacent to the respective carrying portion 226 and to the mounting portion 220. Operation M533 may also include inserting the edges of these carrying portions 226 and mounting portions 220 of all of the spatulas 202 into a respective one of the slots 348 of the comb 346.

Figure 5G:
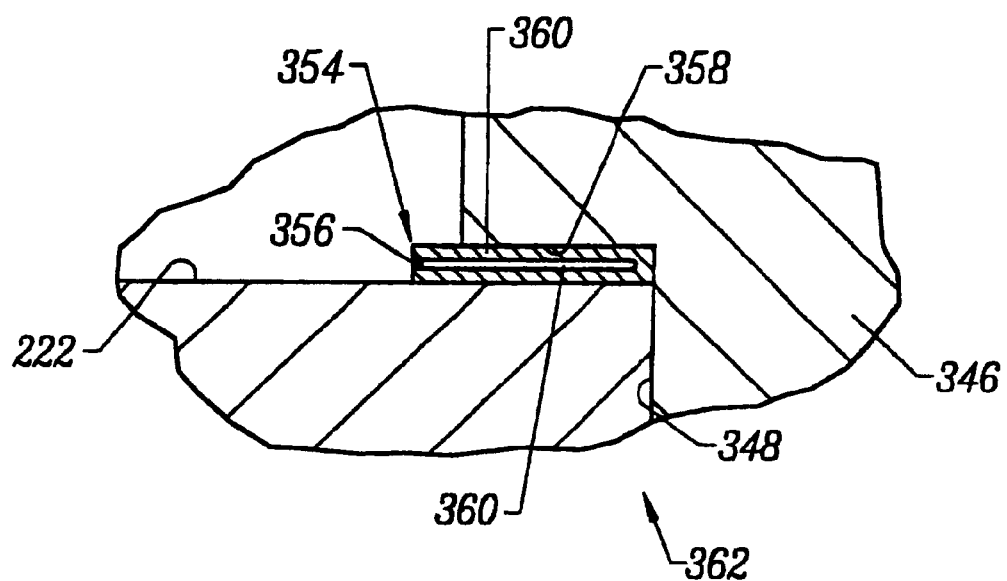
FIG. 5G is an enlarged view of a portion of FIG. 5F illustrating spring clips used in the fixturing with the comb.

FIGS. 5F and 5G illustrate a final aspect of operation M533 of this fixturing, which is to insert a spring clip 354 into a space 356 between the upper surface 222 of the spatula and an under surface 358 of the slot 348 of the comb 346. The clip 354 is a U-shaped resilient member having legs 360 self-biased apart. As shown in the enlarged FIG. 5G, the legs 360 of the clip 354 has been pressed together as it was inserted into the space 356, which holds the spatulas 202 in the slots 348. The result of this fixturing process is referred to as a fixtured end effector 362, and is as shown in FIG. 5E.

The fixtured end effector 362 is then processed in a further operation M534, in which there is gradual pre-heating of the fixtured end effector 362. The preheating operation M534 is a standard operation in dip brazing, such that one skilled in the art will understand that the pre-heating is typically performed in an oven (not shown) to increase the temperature of the fixtured end effector 362 to 1000 degrees F. As further illustrated in FIG. 7C, as operation M535, in a standard manner the pre-heated fixtured end effector 362 is then immersed in a molten lithium bath (not shown) having a temperature of 1100 degrees F. to activate the brazing filler 336. In the immersion, the aluminum material from which the end effector 200 is fabricated changes from a T4 condition to a T0 condition and becomes softer. In another operation M536 illustrated in FIG. 7C, the brazed end effector 200 is cooled in air at room temperature for about twelve hours. In an operation M537 the combs 346 and the clips 354 are removed from the cool end effector 200. In a final operation M538, the end effector 200 is cleaned in a standard post-brazing operation by using an acid solution and a final water rinse.

Although the foregoing invention has been described in some detail for purposes of clarity of understanding, it will be apparent that certain changes and modifications may be practiced within the scope of the appended claims. In addition, although the preferred materials used to make the end effector 200 is plate aluminum and stainless steel as described above, any other suitable material, such as steel, etc., may be substituted therefor. Therefore, the present embodiments are to be considered as illustrative and not restrictive, and the invention is not to be limited to the details given herein, but may be modified within the scope and equivalence of the appended claims.

What is claimed is:

1. A tower for holding components of an end effector, wherein the components are to be accurately held relative to each other, the tower comprising:

column having a plurality of grooves formed therein, each of the grooves being dimensioned to receive one of the components and defining a ledge so that the plurality of grooves define a plurality of ledges along the column;

the column having a base provided with a reference ledge to define a reference surface;

a first of additional ledges being spaced by a selected distance from the reference surface;

successive ones of the additional ledges being spaced from the reference surface by a uniformly increasing multiple of the selected distance so that the plurality of additional ledges are evenly and accurately spaced from the reference surface; wherein the components are spatulas for holding wafers for semiconductor processing, the spatulas having edges that intersect at a given angle, the tower further having, the column being formed from a plurality of walls, wherein each of the walls extends away from the reference surface and is substantially planar; and the walls intersecting to define an intersection at a tower angle substantially the same as the given angle.

2. A tower according to claim 1, wherein:

the intersection of the walls is along a first line; and each of the grooves extends across the first line so that each groove and each respective ledge of the groove extends continuously along the plurality of walls.

3. A tower according to claim 1, the tower further comprising:

a hollow cylinder formed integrally with the column; and the cylinder having a split portion defining a pair of opposed spaced flanges for clamping the tower in position to hold the components.

4. A tower according to claim 3, wherein:

the flanges are provided with at least one pair of opposed holes; and fasteners extend through the at least one pair of the opposed holes for urging the flanges together to clamp the tower in the component holding position.

5. A tower for holding components of an end effector, comprising:

a base surface;

a vertical member having a plurality of grooves; and a plurality of ledges being defined by the grooves, the plurality of ledges being configured to hold the components of the end effector, wherein the ledges are spaced the multiple of the selected distance from the base surface, wherein the components are spatulas for mounting wafers, the spatulas having edges that intersect at a given angle, further including, a plurality of walls extending from the base surface, wherein the walls are substantially planar and the grooves and the ledges are formed on the walls; and the walls intersect to define an intersection at a tower angle such that the tower angle is substantially the same as the given angle.

6. A tower for holding components of an end effector as recited in claim 5, wherein the grooves and the ledges are formed at the intersection of the walls such that the grooves and the ledges are continuous along the walls and the intersection.

7. A tower for holding components of an end effector as recited in claim 5, further comprising:

a column formed from the plurality of walls, wherein the column has a hollow cylinder integrally formed with the column; and the hollow cylinder having a split portion defining a pair of opposed spaced flanges for clamping the tower in position to hold the components.

8. A tower for holding components of an end effector as recited in claim 7, wherein the opposed spaced flanges have at least one pair of opposed holes such that fasteners extend through the at least one pair of holes for urging the opposed space flanges together to clamp the tower in the position to hold the components.

9. A tower for holding components of an end effector, comprising:

a base surface;

a vertical member extending from the base surface;

a plurality of grooves defined in the vertical member, each groove having a ledge that is a multiple of a distance from the base surface, wherein the grooves are dimensioned such that the grooves can receive the components of the end effector and the groove can accurately hold the components relative to each other, the vertical member defines a plurality of walls such that the walls define the grooves and the ledges;

a column formed from the plurality of walls, wherein the column has a hollow cylinder integrally formed with the column; and the hollow cylinder having a split portion defining a pair of opposed spaced flanges for clamping the tower in position to hold the components.

10. A tower for holding components of an end effector as recited in claim 9, the opposed spaced flanges have at least one pair of opposed holes such that fasteners extend through the at least one pair of holes for urging the opposed space flanges together to clamp the tower in the position to hold the components.

* * * * *